(12) United States Patent
Kim et al.

(10) Patent No.: US 11,925,051 B2
(45) Date of Patent: Mar. 5, 2024

(54) DISPLAY DEVICE INCLUDING AN ENCAPSULATION LAYER INCLUDING POROUS LAYER

(71) Applicant: Samsung Display Co., Ltd., Yongin-si (KR)

(72) Inventors: Yong Tack Kim, Yongin-si (KR); Eung Seok Park, Seoul (KR); Jae Hyuk Lee, Cheonan-si (KR); Yoon Hyeung Cho, Yongin-si (KR); Dong Uk Choi, Sejong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 377 days.

(21) Appl. No.: 17/315,009

(22) Filed: May 7, 2021

(65) Prior Publication Data
US 2022/0059799 A1 Feb. 24, 2022

(30) Foreign Application Priority Data

Aug. 21, 2020 (KR) .......................... 10-2020-0105185

(51) Int. Cl.
*H10K 50/844* (2023.01)
*H10K 50/86* (2023.01)
*H10K 59/124* (2023.01)
*H10K 59/38* (2023.01)

(52) U.S. Cl.
CPC ......... *H10K 50/844* (2023.02); *H10K 50/865* (2023.02); *H10K 59/124* (2023.02); *H10K 59/38* (2023.02)

(58) Field of Classification Search
None
See application file for complete search history.

(56) References Cited

U.S. PATENT DOCUMENTS

2013/0181602 A1* 7/2013 Kang ................. H10K 50/8445
313/504
2014/0070187 A1 3/2014 Cho et al.
(Continued)

FOREIGN PATENT DOCUMENTS

JP 2015-026417 A 2/2015
KR 10-0544127 B1 1/2006
(Continued)

*Primary Examiner* — Nduka E Ojeh
(74) *Attorney, Agent, or Firm* — Lewis Roca Rothgerber Christie LLP

(57) ABSTRACT

A display device includes: a first base having a display area; light-emitting elements on the first base; and an encapsulation layer over the light-emitting elements. The encapsulation layer includes: a first inorganic layer; an organic layer on the first inorganic layer; and a second inorganic layer on the organic layer. The first inorganic layer includes: a first buffer layer on the light-emitting elements; a first barrier layer on the first buffer layer; a first porous layer on the first barrier layer; a second barrier layer on the first porous layer; and a second buffer layer on the second barrier layer. A refractive index of the first buffer layer, the first barrier layer, and the first porous layer are different from one another, and the refractive index of the first porous layer is smaller than the refractive index of the first buffer layer and the first barrier layer.

23 Claims, 24 Drawing Sheets

(56) References Cited

U.S. PATENT DOCUMENTS

| | | | |
|---|---|---|---|
| 2015/0021565 A1* | 1/2015 | Min | H10K 59/12 |
| | | | 257/40 |
| 2015/0028306 A1 | 1/2015 | Kim et al. | |
| 2015/0108453 A1* | 4/2015 | Oh | H01L 23/293 |
| | | | 257/40 |
| 2020/0258946 A1 | 8/2020 | Kim et al. | |
| 2021/0399260 A1 | 12/2021 | Kim et al. | |

FOREIGN PATENT DOCUMENTS

| | | |
|---|---|---|
| KR | 10-1862676 B1 | 6/2018 |
| KR | 10-2021029 B1 | 9/2019 |
| KR | 10-2060622 B1 | 12/2019 |
| KR | 10-2080752 B1 | 2/2020 |
| KR | 2020-0097373 A | 8/2020 |
| KR | 10-2021-0156371 | 12/2021 |

* cited by examiner

DISPLAY DEVICE INCLUDING AN ENCAPSULATION LAYER INCLUDING POROUS LAYER

CROSS-REFERENCE TO RELATED APPLICATION

This application claims priority to and the benefit of Korean Patent Application No. 10-2020-0105185 filed on Aug. 21, 2020 in the Korean Intellectual Property Office (KIPO), the entire disclosure of which is incorporated herein by reference.

BACKGROUND

1. Field

The present disclosure relates to a display device.

2. Description of Related Art

Display devices are becoming more and more important as multimedia technology evolves. Accordingly, a variety of display devices such as liquid-crystal display devices (LCDs) and organic light-emitting diode display devices (OLEDs) are currently being developed.

Among display devices, a self-luminous display device includes a self-luminous element (e.g., an organic light-emitting element). A self-luminous element may include two opposing electrodes and an emissive layer interposed therebetween. For an organic light-emitting element as a self-luminous element, electrons and holes supplied from the two opposing electrodes are recombined in the emissive layer to generate excitons, the generated excitons relax from the excited state to the ground state and accordingly light can be emitted.

Such a self-luminous display device may not require a separate light source such as a backlight unit, and thus the self-luminous display device may consume less power and may be made light and thin, as well as exhibiting high-quality characteristics such as wide viewing angle, high luminance and contrast, and fast response speed. Accordingly, organic light-emitting display devices are attracting attention as the next generation display device.

SUMMARY

Aspects of the present disclosure are directed towards a display device that can be stored more reliably.

These and other aspects, embodiments and advantages of the present disclosure will become immediately apparent to those of ordinary skill in the art upon review of the Detailed Description and Claims to follow.

According to one or more embodiments of the present disclosure, a display device includes: a first base having a display area and a non-display area; light-emitting elements on the first base, the light-emitting elements being located in the display area; and an encapsulation layer over the light-emitting elements. The encapsulation layer includes: a first inorganic layer; an organic layer on the first inorganic layer; and a second inorganic layer on the organic layer. The first inorganic layer includes: a first buffer layer on the light-emitting elements; a first barrier layer on the first buffer layer; a first porous layer on the first barrier layer; a second barrier layer on the first porous layer; and a second buffer layer on the second barrier layer. A refractive index of the first buffer layer, a refractive index of the first barrier layer, and a refractive index of the first porous layer are different from one another, and the refractive index of the first porous layer is smaller than the refractive index of the first buffer layer and the refractive index of the first barrier layer.

The first barrier layer may be between the first buffer layer and the first porous layer. The second barrier layer may be between the first porous layer and the second buffer layer. The second buffer layer may be between the second barrier layer and the organic layer.

The refractive index of the first buffer layer may be smaller than the refractive index of the first barrier layer.

The refractive index of the first porous layer may be in a range of 1.1 to 1.45.

The refractive index of the first buffer layer may be in a range of 1.3 to 1.75.

The refractive index of the barrier layer may be in a range of 1.45 to 1.85.

The refractive index of the first buffer layer may be equal to the refractive index of the second buffer layer.

The second buffer layer may be directly on the organic layer.

A surface roughness of the second buffer layer may be in a range of 10 nm to 500 nm.

A surface energy of the second buffer layer may be in a range of 40 mN/m to 80 mN/m.

The second inorganic layer may include a third buffer layer on the organic layer and a third barrier layer on the third buffer layer.

The refractive index of the third buffer layer may be smaller than the refractive index of the third barrier layer.

The second inorganic layer further may include a fourth buffer layer on the third barrier layer. The third buffer layer may be between the organic layer and the third barrier layer. The third barrier layer may be between the third buffer layer and the fourth buffer layer.

The display device may further include: a second base above the encapsulation layer; color filters on a surface of the second base facing the first base, the color filters overlapping the light-emitting elements; wavelength conversion patterns on the color filters; and a filler between the first base and the second base The display device may further include thin-film transistors between the first base and the light-emitting elements of the display area, the thin-film transistors electrically connected to the light-emitting elements. Each of the thin-film transistors may include: a semiconductor layer on the first base; a gate electrode on the semiconductor layer; a source electrode connected to the semiconductor layer; and a drain electrode connected to the semiconductor layer. The semiconductor layer may include an oxide semiconductor.

Each of the light-emitting elements may include: an anode electrode above the source electrode and the drain electrode; a cathode electrode facing the anode electrode; and a plurality of emissive layers between the anode electrode and the cathode electrode. The plurality of emissive layers forms a tandem structure in which the plurality of emissive layers overlap each other.

The display device may further include a light-blocking pattern between the first base and the semiconductor layer, the light-blocking pattern overlapping the semiconductor layer. The light-blocking pattern may be electrically connected to the source electrode or the drain electrode.

The fourth buffer layer may be in direct contact with the filler. A surface roughness of the fourth buffer layer may be in a range of 10 nm to 500 nm. A surface energy of the fourth buffer layer may be in a range of 40 mN/m to 80 mN/m.

The second inorganic layer may further include: a fourth barrier layer between the third barrier layer and the fourth buffer layer; and a second porous layer between the fourth barrier layer and the third barrier layer. A refractive index of the second porous layer may be smaller than the refractive index of the third buffer layer of the second inorganic layer, the refractive index of the third barrier layer, a refractive index of the fourth barrier layer, and a refractive index of the fourth buffer layer.

According to one or more embodiments of the present disclosure, a display device includes: a first base having a display area and a non-display area; light-emitting elements on the first base, the light-emitting elements being located in the display area; and an encapsulation layer over the light-emitting elements. The encapsulation layer includes: a first inorganic layer; an organic layer on the first inorganic layer; and a second inorganic layer on the organic layer. The second inorganic layer includes: a first buffer layer on the organic layer; a first barrier layer on the first buffer layer; a first porous layer on the first barrier layer; a second barrier layer on the first porous layer; and a second buffer layer on the second barrier layer. A refractive index of the first buffer layer, a refractive index of the first barrier layer, and a refractive index of the first porous layer are different from one another. The refractive index of the first porous layer is smaller than the refractive index of the first buffer layer and the refractive index of the first barrier layer.

The first inorganic layer may include: a third buffer layer on the light-emitting elements; and a third barrier layer on the third buffer layer.

The first barrier layer may be between the first buffer layer and the first porous layer. The second barrier layer may be between the first porous layer and the second buffer layer. The second buffer layer may be between the second barrier layer and the organic layer.

The refractive index of the first buffer layer may be less than the refractive index of the first barrier layer. The refractive index of the first porous layer may be in a range of 1.1 to 1.45. The refractive index of the first buffer layer may be in a range of 1.3 to 1.75. The refractive index of the barrier layer may be in a range of 1.45 to 1.85

Additional details of one or more embodiments of the subject matter described in this specification are set forth in the accompanying drawings and the description below.

According to embodiments of the present disclosure, a display device can be stored more reliably.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
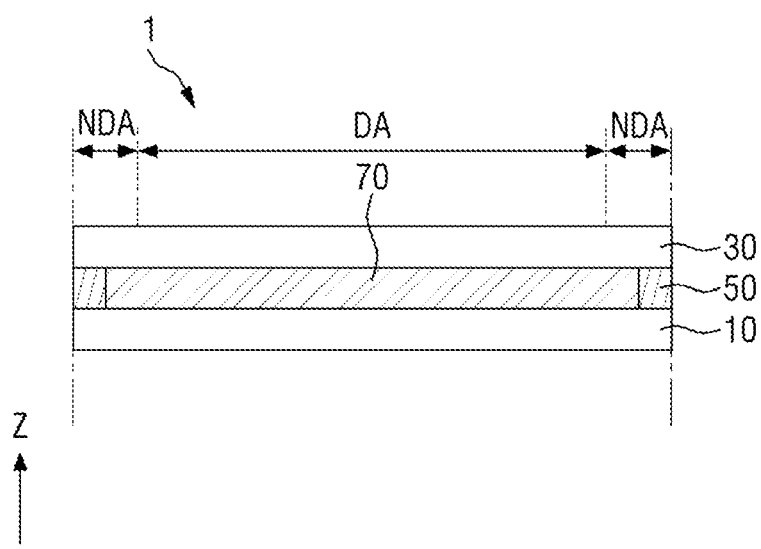
FIG. 1 is a cross-sectional view illustrating a stack structure of a display device according to an embodiment of the present disclosure.

Specific structural and functional descriptions of embodiments of the present disclosure disclosed herein are only for illustrative purposes of the embodiments of the present disclosure. The present disclosure may be embodied in many different forms without departing from the spirit and significant characteristics of the present disclosure. Therefore, the embodiments of the present disclosure are disclosed only for illustrative purposes and should not be construed as limiting the present disclosure.

It will be understood that when an element is referred to as being related to another element such as being "coupled"

or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or" depending on the context of the description without being limited thereto, as those skilled in the art would appreciate. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About," "substantially," or "approximately" as used herein is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" can refer to within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the accompanying drawings.

FIG. 1 is a cross-sectional view illustrating a stack structure of a display device according to an embodiment of the present disclosure.

A display device 1 shown in FIG. 1 may be employed in a variety of electronic devices including small-and-medium sized electronic devices such as a tablet PC, a smartphone, a vehicle navigation unit, a camera, a center information display (CID) installed in vehicles, a wrist-type electronic device, a personal digital assistant (PMP), a portable multimedia player (PMP) and a game machine, and medium-and-large electronic devices such as a television, an electric billboard, a monitor, a personal computer and a laptop computer. It should be understood that the above-listed electronic devices are merely illustrative and the display device 1 may be employed in a variety of other electronic devices without departing from the scope of the present disclosure.

The display device 1 may include a display area DA where images are displayed, and a non-display area NDA where no image is displayed. In some embodiments, the non-display area NDA may be disposed around the display area DA to surround it. Images displayed on the display area DA may be seen by a user from the side indicated by the arrow in the third direction Z.

In some embodiments, the stack structure of the display device 1 may include a display substrate 10, and a color conversion substrate 30 opposite to the display substrate 10, and may further include a sealing member 50 used to couple the display substrate 10 with the color conversion substrate 30, and a filler 70 used to fill a space between the display substrate 10 and the color conversion substrate 30, as shown in FIG. 1.

The display substrate 10 may include elements and circuits for displaying images (e.g., a pixel circuit such as a switching element), a pixel-defining layer for defining an emission area and a non-emission area in the display area DA to be described in more detail below, and a self-luminous element. In an embodiment, the self light-emitting element may include at least one of an organic light-emitting diode, a quantum-dot light-emitting diode, and an inorganic-based micro light-emitting diode (e.g., Micro LED), and an inorganic-based nano light-emitting diode having a nano size (e.g., Nano LED). In the following description, an organic light-emitting diode will be described in more detail as an example of the self-luminous element for convenience of illustration.

The color conversion substrate 30 may be located on the display substrate 10 and may face the display substrate 10. In some embodiments, the color conversion substrate 30 may include a color conversion pattern that converts the color of incident light. In some embodiments, the color conversion substrate 30 may include a color filter and/or a wavelength conversion pattern as the color conversion pattern. In some embodiments, the color conversion substrate 30 may include both the color filter and the wavelength conversion pattern.

The sealing member 50 may be disposed between the display substrate 10 and the color conversion substrate 30 in the non-display area NDA. A sealing member 50 may be disposed along the edges of the display substrate 10 and the color conversion substrate 30 in the non-display area NDA to surround the display area DA in a plan view or when viewed from the top. The display substrate 10 and the color conversion substrate 30 may be coupled to each other via the sealing member 50.

In some embodiments, the sealing member 50 may be made of an organic material. For example, the sealing member 50 may be made of, but is not limited to, an epoxy resin. In some other embodiments, the sealing member 50 in the form of glass frit may be employed.

The filler 70 may be located in the space between the display substrate 10 and the color conversion substrate 30 surrounded by the sealing member 50. The filler 70 may be used to fill the space between the display substrate 10 and the color conversion substrate 30.

In some embodiments, the filler 70 may be made of a material that transmits light. In some embodiments, the filler 70 may be made of an organic material. For example, the filler 70 may be made of a silicon-based organic material, an epoxy-based organic material or a mixture of a silicon-based organic material, an epoxy-based organic material, etc.

In some embodiments, the filler 70 may be made of a material having an extinction coefficient of substantially zero. The refractive index and the extinction coefficient are correlated, and thus the refractive index decreases with the extinction coefficient. If the refractive index is approximately 1.7 or less, the extinction coefficient may converge to substantially zero. In some embodiments, the filler 70 may be made of a material having a refractive index of approximately 1.7 or less. Accordingly, it is possible to prevent or substantially prevent light provided by the self-luminous element from passing through the filler 70 and being absorbed by the filler 70. In some embodiments, the filler 70 may be made of an organic material having a refractive index of approximately 1.4 to approximately 1.6.

Figure 2:
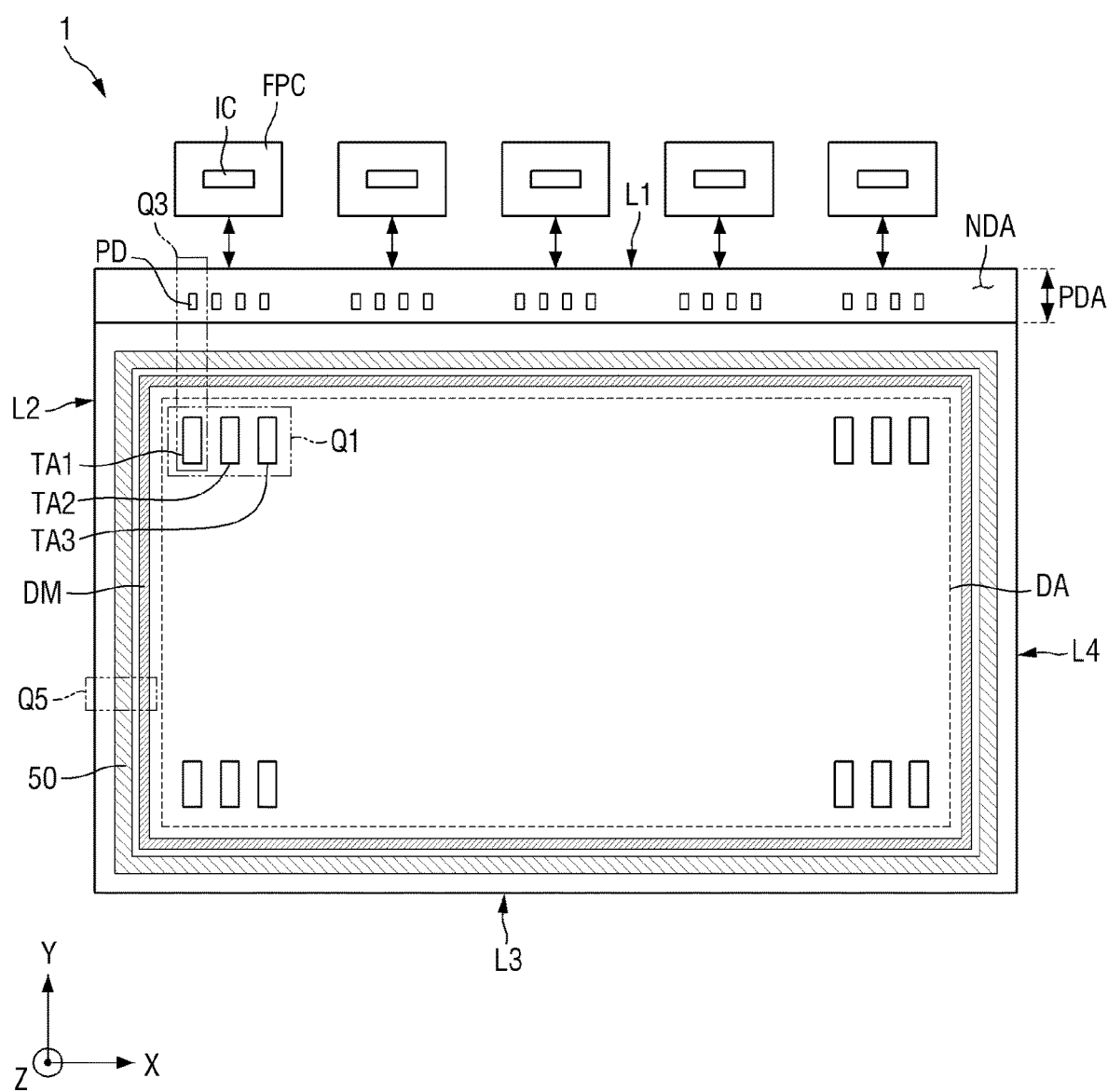
FIG. 2 is a plan view of a display device according to an embodiment of the present disclosure.
Figure 3:
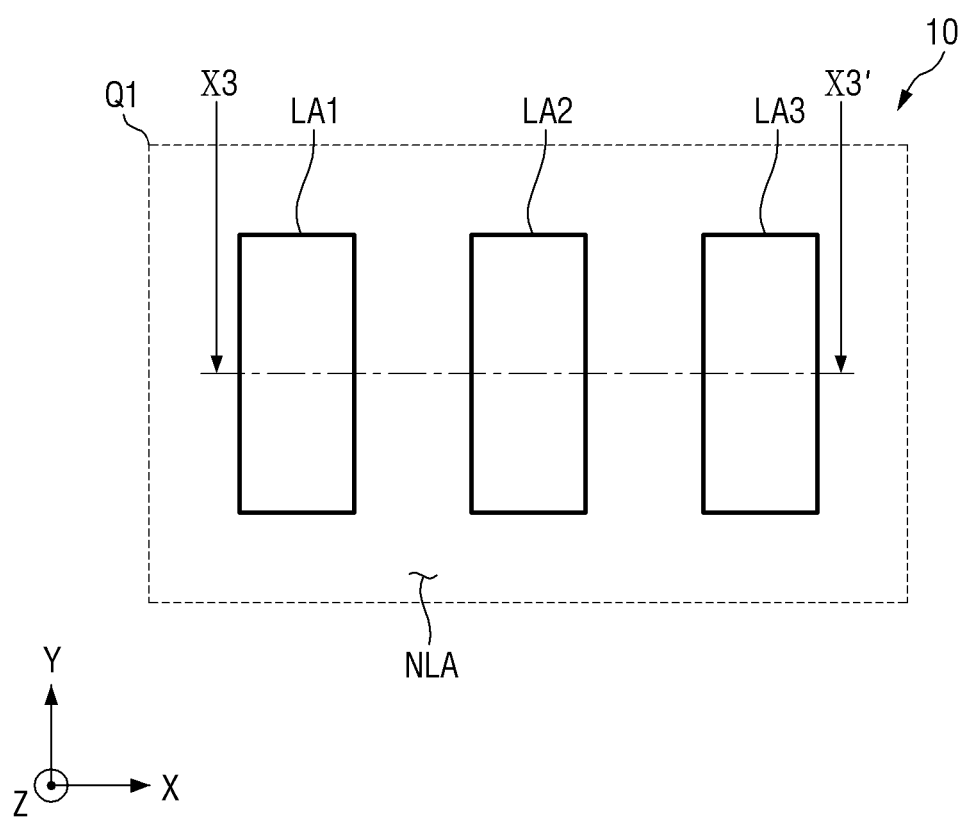
FIG. 3 is an enlarged, plan view of portion Q1 of FIG. 2, more specifically, a plan view of a display substrate included in the display device of FIG. 2.
Figure 4:
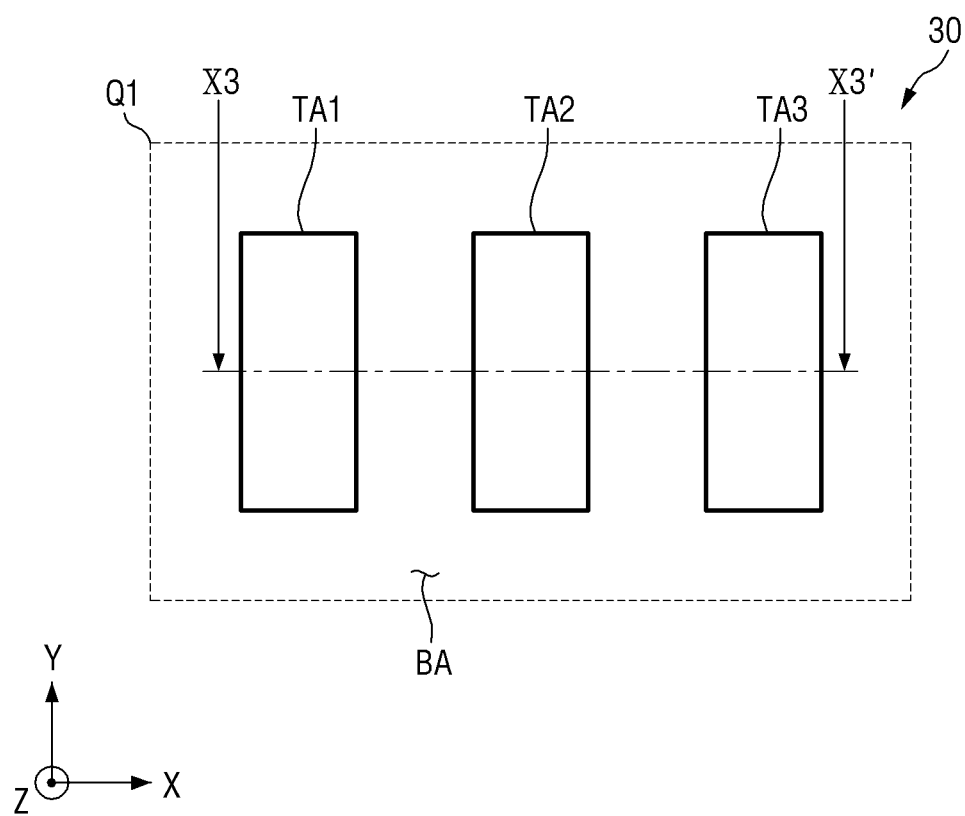
FIG. 4 is an enlarged plan view of portion Q1 of FIG. 2, more specifically, a plan view of a color conversion substrate included in the display device of FIG. 2.
Figure 5:
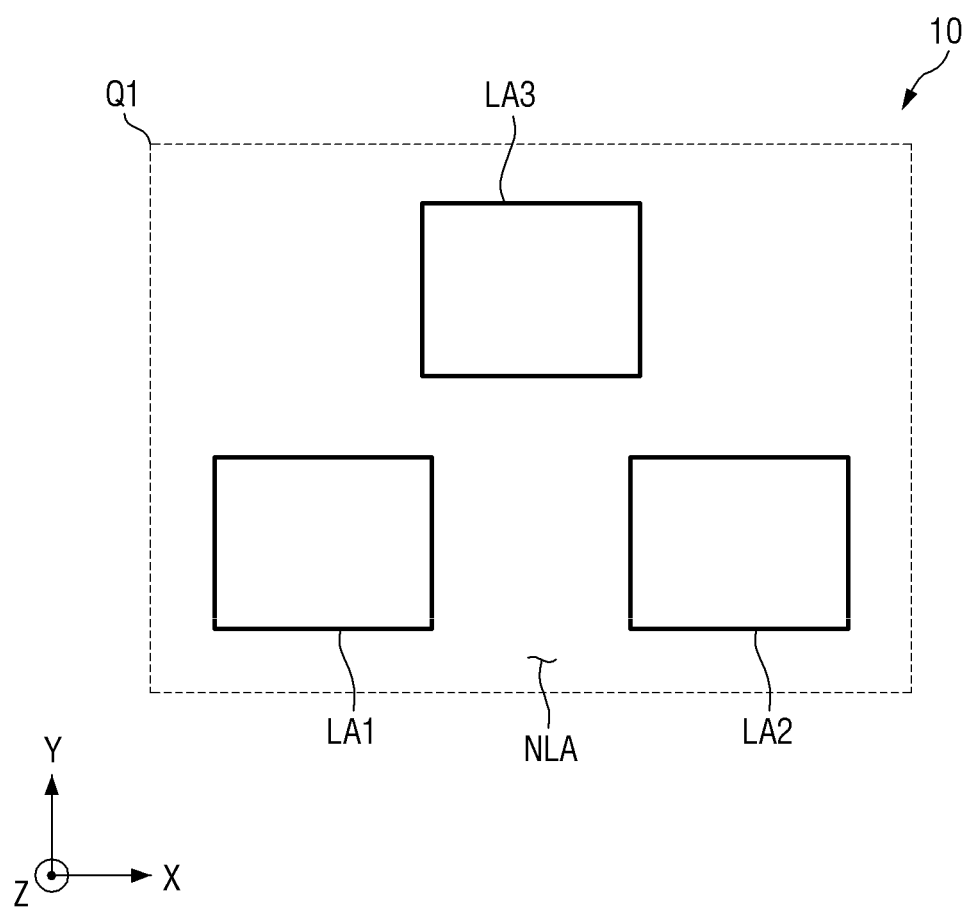
FIG. 5 is a plan view of a modification of the example shown in FIG. 3.
Figure 6:
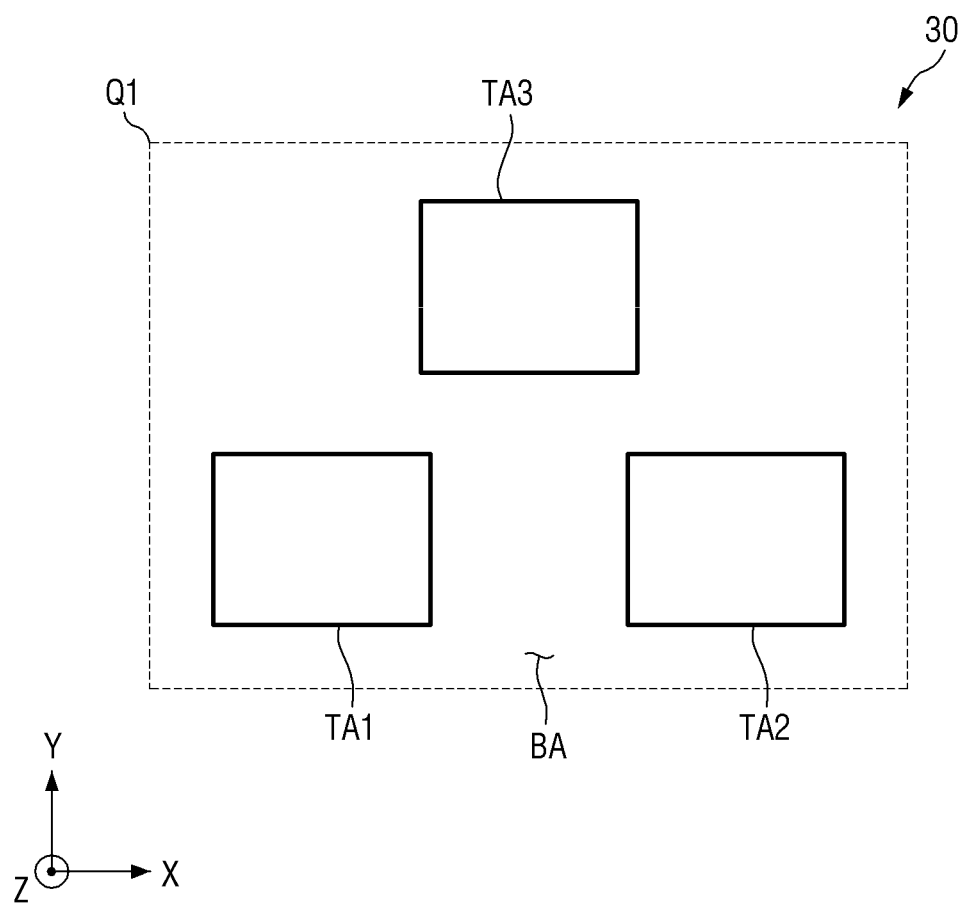
FIG. 6 is a plan view showing a modification of the example shown in FIG. 4.
Figure 7:
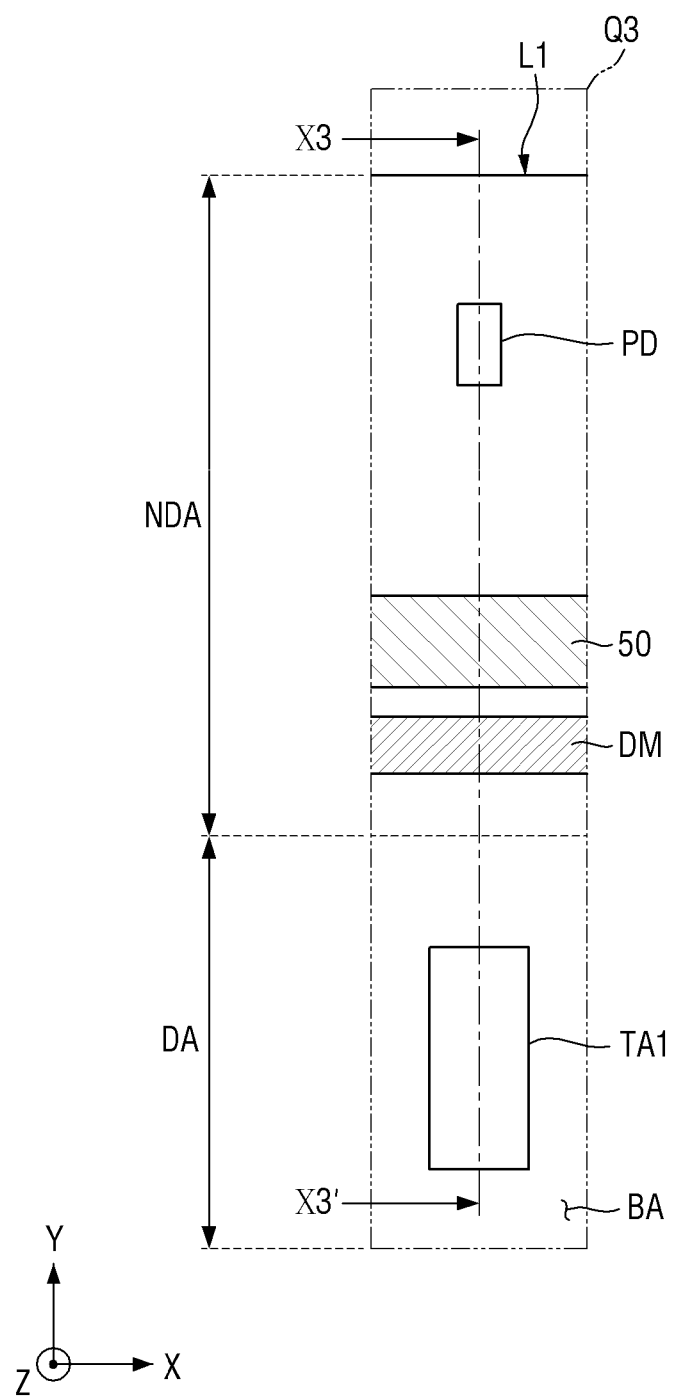
FIG. 7 is an enlarged plan view of portion Q3 of FIG. 2.
Figure 8:
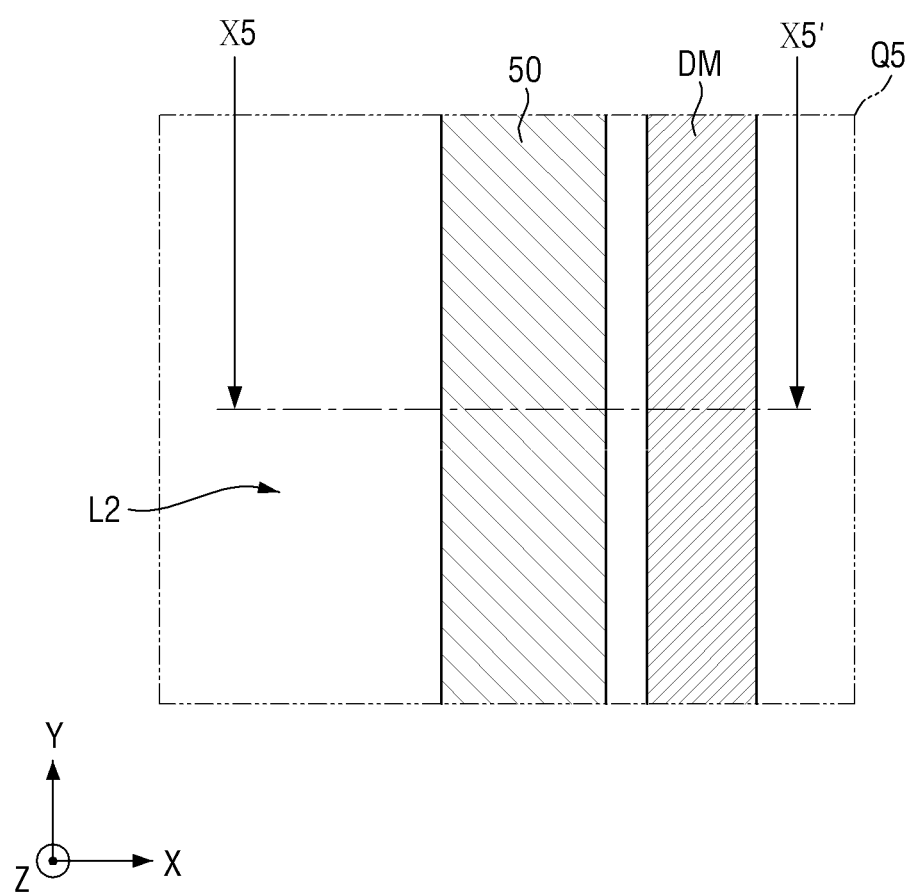
FIG. 8 is an enlarged plan view of portion Q5 of FIG. 2.

FIG. 2 is a plan view of a display device according to an embodiment of the present disclosure. FIG. 3 is an enlarged, plan view of portion Q1 of FIG. 2, more specifically, a plan view of a display substrate included in the display device of FIG. 2. FIG. 4 is an enlarged plan view of portion Q1 of FIG. 2, more specifically, a plan view of a color conversion substrate included in the display device of FIG. 2. FIG. 5 is a plan view showing a modification of the example shown in FIG. 3. FIG. 6 is a plan view showing a modification of the example shown in FIG. 4. FIG. 7 is an enlarged plan view of portion Q3 of FIG. 2. FIG. 8 is an enlarged plan view of portion Q5 of FIG. 2.

Referring to FIGS. 2-8 in conjunction with FIG. 1, in some embodiments, as shown in FIG. 2, the display device 1 may be formed in a rectangular shape in a plan view or when viewed from the top. The display device 1 may include two sides (e.g., a first side L1 and a third side L3) extended in a first direction X, and two sides (e.g., a second side L2 and a fourth side L4) extended in a second direction Y intersecting the first direction X. Although the corners where the sides meet each other may form a right angle, the present disclosure is not limited thereto. In some embodiments, the length of the first side L1 and the third side L3 may be different from the length of the second side L2 and the fourth side L4. For example, the first side L1 and the third side L3 may be longer than the second side L2 and the fourth side L4. The shape of the display device 1 in a plan view or when viewed from the top is not limited to that shown in the drawings. For example, the display device 1 may have a circular shape or any other suitable shape.

In some embodiments, the display device 1 may further include flexible circuit boards FPC and driver chip ICs.

As shown in FIG. 3, a plurality of emission areas and a non-emission area NLA may be defined on the display substrate 10 in the display area DA.

In some embodiments, a first emission area LA1, a second emission area LA2 and a third emission area LA3 may be defined in the display area DA of the display substrate 10. In the emission areas LA1, LA2 and LA3, light generated in the light-emitting elements of the display substrate 10 exits out of the display substrate 10. In the non-emission area NLA, no light exits out of the display substrate 10. In some embodiments, the non-emission area NLA may surround the first emission area LA1, the second emission area LA2 and the third emission area LA3 inside the display area DA.

In some embodiments, the light exits out of the first emission area LA1, the second emission area LA2 and the third emission area LA3 may be light of a third color. In some embodiments, the light of the third color may be blue light and may have a peak wavelength in the range of approximately 440 nm to approximately 480 nm. As used herein, the peak wavelength refers to the wavelength at which the intensity of the light is largest or highest.

In some embodiments, the first emission area LA1, the second emission area LA2 and the third emission area LA3 may form a single group, and a plurality of such groups may be defined in the display area DA.

In some embodiments, as shown in FIG. 3, the first emission area LA1, the second emission area LA2 and the third emission area LA3 may be located sequentially along the first direction X. In some embodiments, the first emission area LA1, the second emission area LA2 and the third emission area LA3 may form a single group and may be repeatedly arranged along the first direction X and along the second direction Y.

It is, however, to be understood that the present disclosure is not limited thereto. The arrangement of the first emission area LA1, the second emission area LA2 and the third emission area LA3 may be altered in a variety of ways in a suitable manner. For example, as shown in FIG. 5, the first emission area LA1 and the second emission area LA2 may be adjacent to each other along the first direction X, while the third emission area LA3 may be located on one side of the first emission area LA1 and the second emission area LA2 along the second direction Y.

In the following description, an example will be described in more detail where the first emission area LA1, the second emission area LA2 and the third emission area LA3 are arranged as shown in FIG. 3.

As shown in FIG. 4, a plurality of light-transmitting areas and a light-blocking area BA may be defined in the color conversion substrate 30 in the display area DA. In the light-transmitting areas light emitted from the display substrate 10 may pass through the color conversion substrate 30 to be provided to the outside of the display device 1. The light blocking area BA may be an area through which light emitted from the display substrate 10 may not pass.

In some embodiments, a first light-transmitting area TA1, a second light-transmitting area TA2 and a third light-transmitting area TA3 may be defined on the color conversion substrate 30.

The first light-transmitting area TA1 may correspond to the first emission area LA1 or may overlap the first emission area LA1. In one or more embodiments, the first light-transmitting area TA1 may have a size equal to a size of the first emission area LA1. Similarly, the second light-transmitting area TA2 may correspond to the second emission area LA2 or may overlap the second emission area LA2, and the third light-transmitting area TA3 may correspond to the third emission area LA3 or may overlap the third emission area LA3. In one or more embodiments, the second light-transmitting area TA2 may have a size equal to a size of the second emission area LA2, and the third light-transmitting area TA3 may have a size equal to a size of the third emission area LA3.

In some embodiments, when the first emission area LA1, the second emission area LA2 and the third emission area LA3 are arranged sequentially along the first direction X as shown in FIG. 3, the first light-transmitting area TA1, the second light-transmitting area TA2 and the third light-transmitting area TA3 may also be arranged sequentially along the first direction X as shown in FIG. 4.

Alternatively, when the first emission area LA1 and the second emission area LA2 are adjacent to each other in the first direction X while the third emission area LA3 is located on one side of the first emission area LA1 and the second emission area LA2 in the second direction Y as shown in FIG. 5, the first light-transmitting area TA1 and the second light-transmitting area TA2 are adjacent to each other in the first direction X while the third light-transmitting area TA3 may be located on one side of the first light-transmitting area TA1 and the second light-transmitting area TA2 in the second direction Y.

In some embodiments, the light of the third color provided from the display substrate 10 may pass through the first light-transmitting area TA1, the second light-transmitting area TA2 and the third light-transmitting area TA3 to exit out of the display device 1. In the following description, the light exiting out of the display device 1 through the first light-transmitting area TA1 is referred to as a first exiting light, the light exiting out of the display device 1 through the second light-transmitting area TA2 is referred to as second exiting light, and the light exiting out of the display device 1 through the third light-transmitting area TA3 is referred to as third exiting light. The first exiting light may be light of a first color, the second exiting light may be light of a second color different from the first color, and the third exiting light may be light of the third color. In some embodiments, the light of the third color may be blue light having a peak wavelength in the range of approximately 440 nm to approximately 480 nm as described above, and the light of the first color may be red light having a peak wavelength in the range of approximately 610 nm to approximately 650 nm. In addition, the light of the second color may be green light having a peak wavelength in the range of approximately 510 nm to approximately 550 nm.

The light-blocking area BA may be disposed in the display area DA around the first light-transmitting area TA1, the second light-transmitting area TA2 and the third light-transmitting area TA3 In some embodiments, the light-blocking BA may surround the first light-transmitting area TA1, the second light-transmitting area TA2 and the third light-transmitting area TA3. In addition, the light-blocking area BA may be located also in the non-display area NDA of the display device 1.

Referring back to FIG. 2, a dam member DM, a sealing member 50 and a first support member may be disposed in the non-display area NDA of the display device 1.

The dam member DM can block or substantially block the overflow of an organic material (or monomers) in the process of forming the encapsulation layer disposed in the display area DA, thereby preventing or substantially preventing the organic material in the encapsulation layer from extending toward the edge of the display device 1.

In some embodiments, the dam member DM may be disposed to surround (e.g., completely surround) the display area DA in a plan view or when viewed from the top.

The sealing member 50 may couple the display substrate 10 with the color conversion substrate 30 as described above.

The sealing member 50 may be disposed in the non-display area NDA on the outer side of the dam member DM and may be disposed to surround (e.g., completely surround) the dam member DM and the display area DA in a plan view or when viewed from the top.

The non-display area NDA of the display device 1 may include a pad area PDA, and a plurality of connection pads PD may be located in the pad area PDA.

In some embodiments, the connection pads PD may be located adjacent to a side (e.g., a longer side) of the non-display area NDA. For example, the connection pads PD may be disposed adjacent to the first side L1 in the non-display area NDA. The connection pads PD may be connected (e.g., electrically connected) to pixel circuits and the like located in the display area DA through connection lines and the like.

The display substrate 10 (e.g., see FIG. 1) of the display device 1 may include the dam member DM and the connection pads PD.

The flexible circuit boards FPC may be connected to the connection pads PD. The flexible circuit boards FPC may connect (e.g., electrically connect) the display substrate 10 (e.g., see FIG. 1) with circuit boards that provide signals, power, etc. for driving the display device 1.

The driver chips IC may be connected (e.g., electrically connected) to the circuit boards and the like to receive data and signals. In some embodiments, the driver chips IC may include a data driver chip and may receive a data control signal and image data from the circuit boards to generate and output a data voltage associated with the image data.

In some embodiments, the driver chips IC may be mounted on the flexible circuit boards FPC, respectively. For example, the driver chips IC may be mounted on the flexible circuit boards FPC by any suitable chip-on-film (COF) technique known to those of ordinary skill in the art.

The data voltage supplied from the driver chips IC, the supply voltage supplied from the circuit boards, etc. may be transmitted to the pixel circuit of the display substrate 10 (e.g., see FIG. 1) through the flexible circuit boards FPC and the connection pads PD.

Hereinafter, the structure of the display device 1 will be described in more detail.

Figure 9:
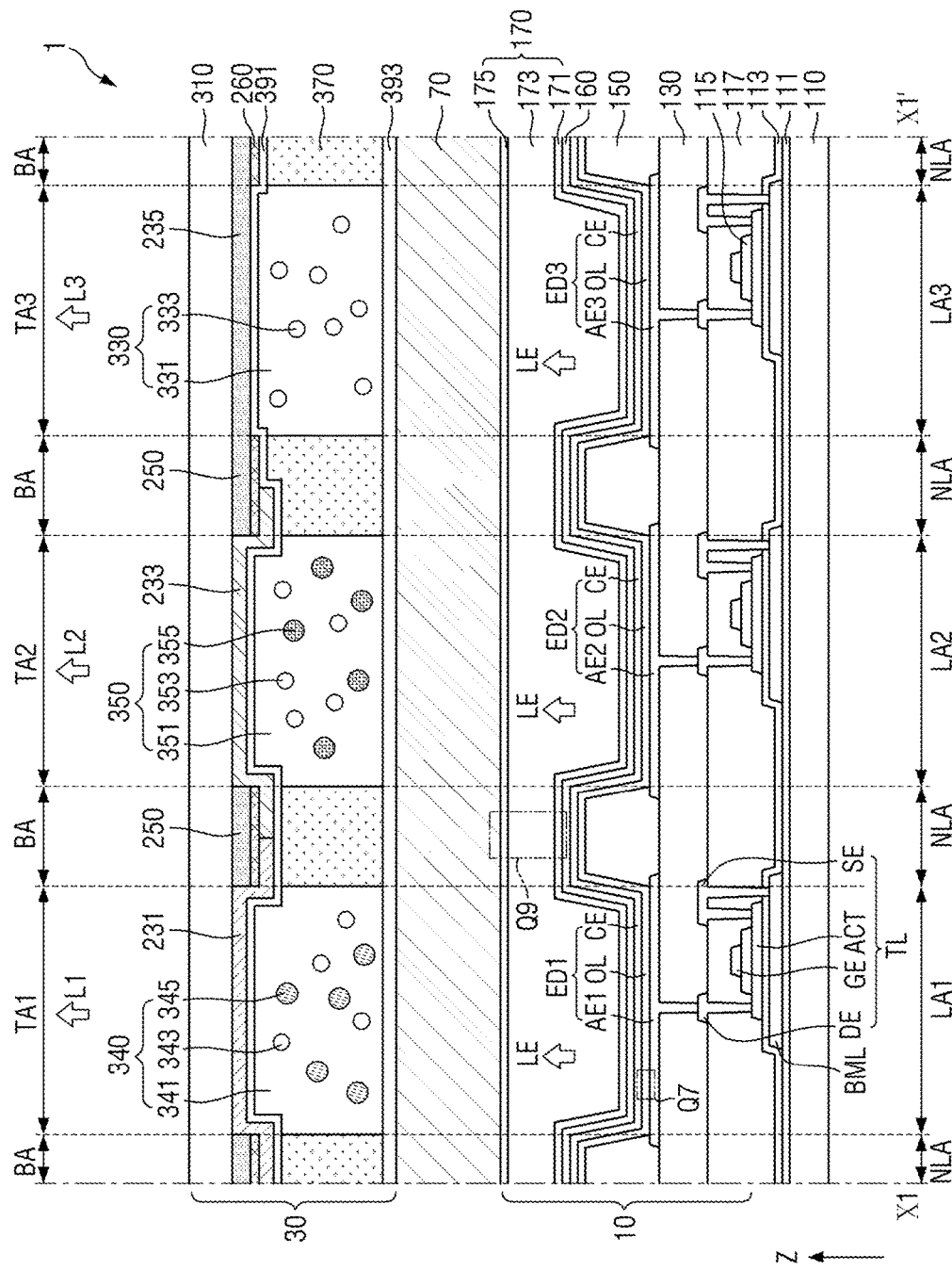
FIG. 9 is a cross-sectional view of the display device according to an embodiment of the present disclosure, taken along the line X1-X1' of FIGS. 3 and 4.
Figure 10:
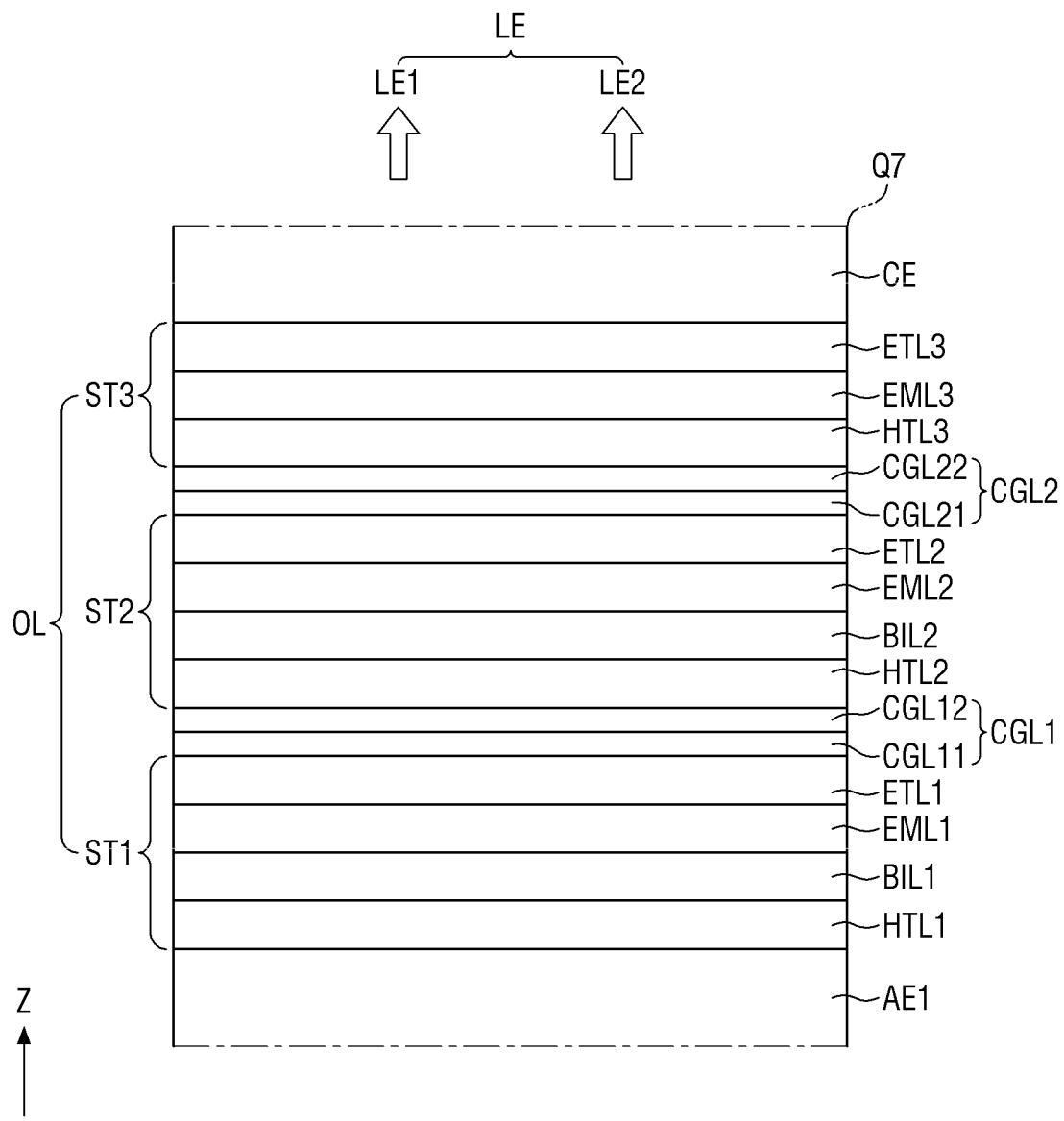
FIG. 10 is an enlarged cross-sectional view of portion Q7 of FIG. 9.
Figure 11:
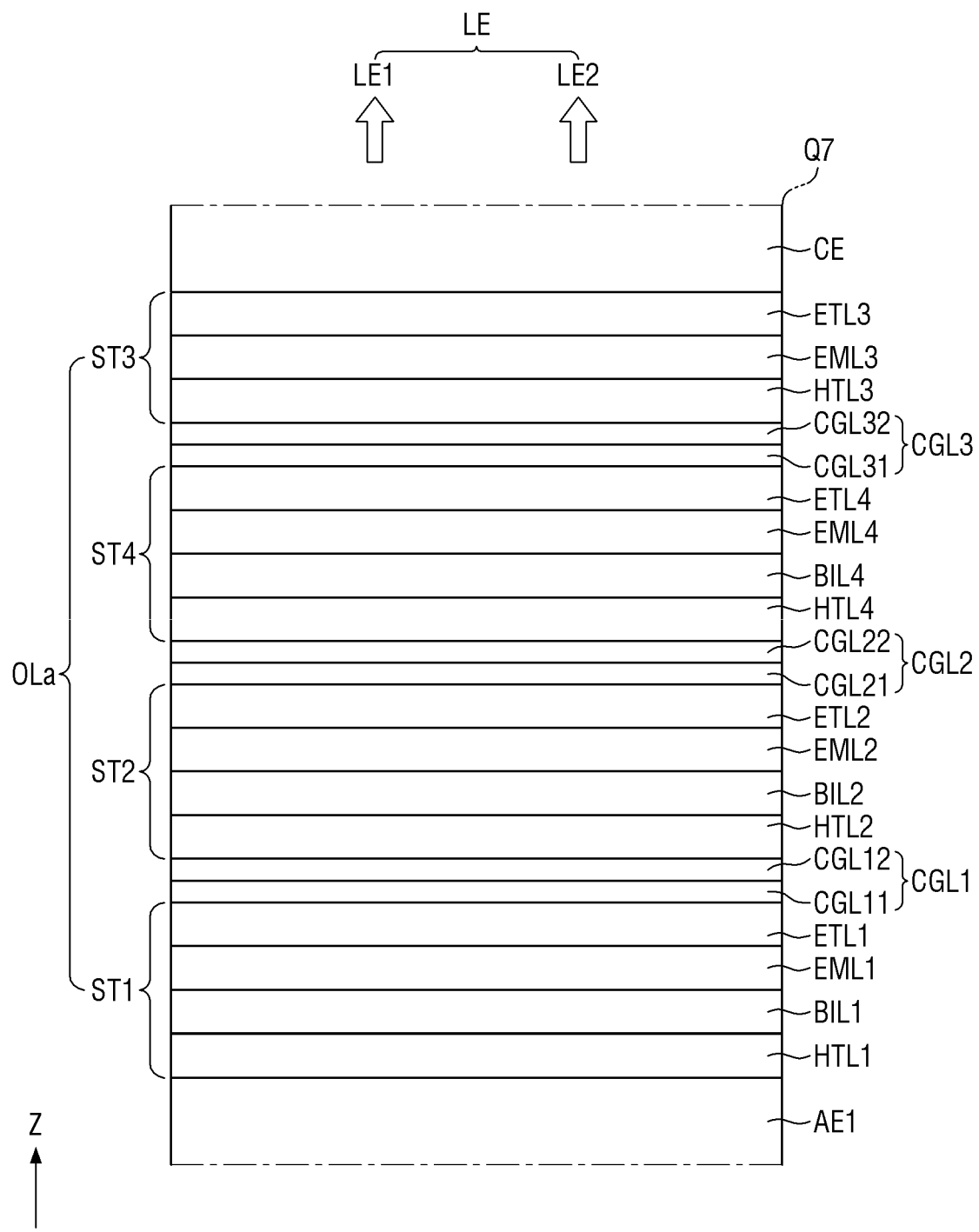
FIG. 11 is a cross-sectional view showing a modification of the structure shown in FIG. 10.
Figure 12:
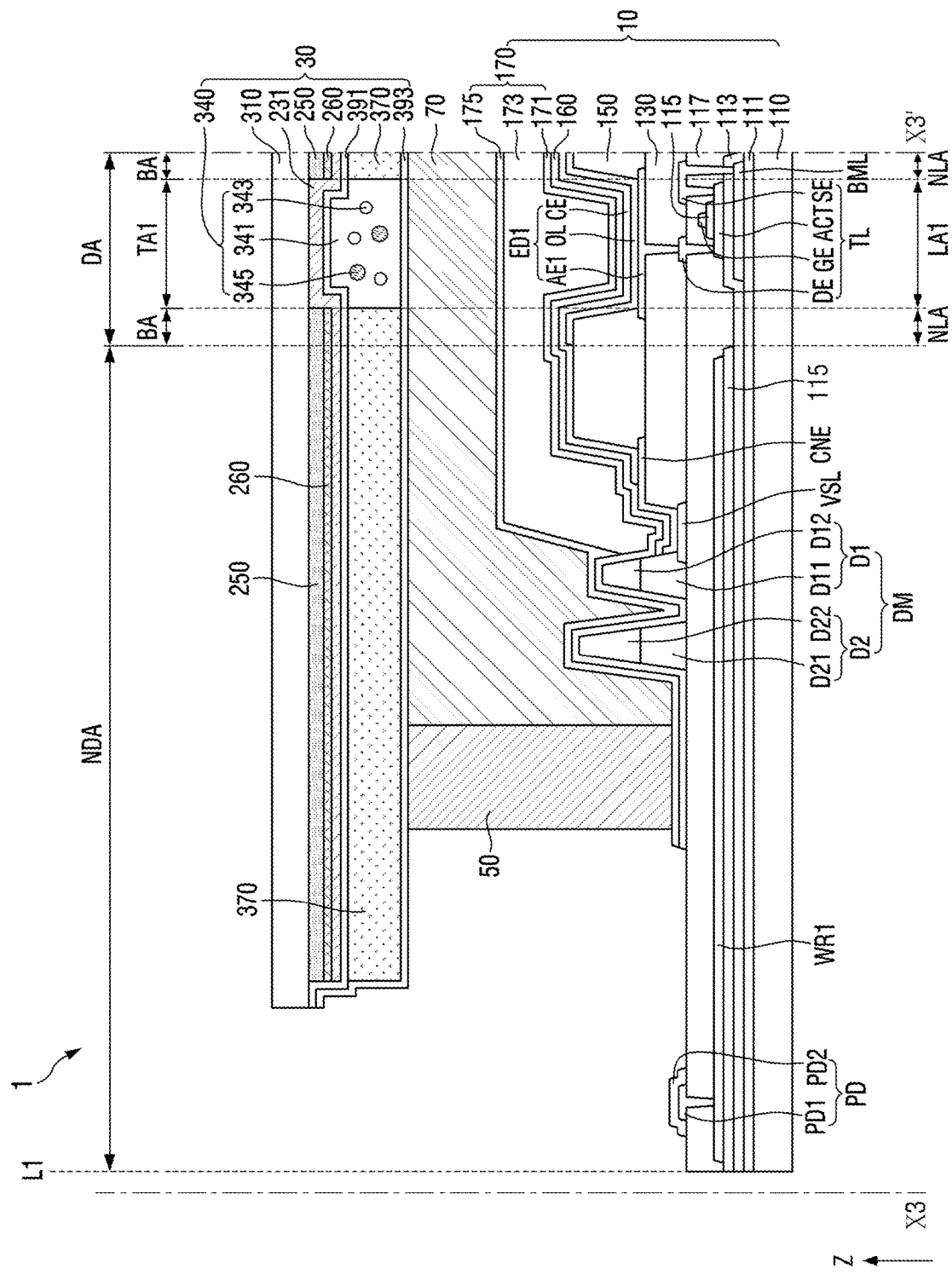
FIG. 12 is a cross-sectional view of the display device according to an embodiment of the present disclosure, taken along the line X3-X3' of FIG. 7.

FIG. 9 is a cross-sectional view of the display device according to an embodiment of the present disclosure, taken along the line X1-X1' of FIGS. 3 and 4. FIG. 10 is an enlarged cross-sectional view of portion Q7 of FIG. 9. FIG. 11 is a cross-sectional view showing a modification of the structure shown in FIG. 10. FIG. 12 is a cross-sectional view of the display device according to an embodiment of the present disclosure, taken along the line X3-X3' of FIG. 7.

Referring to FIGS. 9-12 in conjunction with FIGS. 1-8, the display device 1 may include the display substrate 10 and the color conversion substrate 30 as described above, and may further include the filler 70 disposed between the display substrate 10 and the color conversion substrate 30.

Hereinafter, the display substrate 10 will be described in more detail.

A first base 110 may be made of a light-transmitting material. In some embodiments, the first base 110 may be a glass substrate or a plastic substrate. When the first base 110 is a plastic substrate, the first base 110 may have flexibility.

In some embodiments, the plurality of emission areas LA1, LA2 and LA3 and the non-emission area NLA may be defined on the first base 110 in the display area DA, which has been described above.

In some embodiments, the first side L1, the second side L2, the third side L3 and the fourth side L4 of the display device 1 may be identical to the four sides of the first base 110, respectively. That is to say, the first side L1, the second side L2, the third side L3 and the fourth side L4 of the display device 1 may be referred to as the first side L1, the second side L2, the third side L3, and the fourth side L4, respectively.

A buffer layer 111 may be further disposed on the first base 110. The buffer layer 111 may be disposed on the first base 110 in the display area DA and the non-display area NDA. The buffer layer 111 may block or substantially block foreign substances or moisture from permeating through the first base 110. For example, the buffer layer 111 may include an inorganic material such as $SiO_2$, $SiN_x$, and SiON, and may be made up of a single layer or multiple layers.

A light-blocking pattern BML may be disposed on the buffer layer 111. The light-blocking pattern BML may block or substantially block external light or light from the light-emitting element from entering a semiconductor layer ACT, which will be described in more detail below, thereby preventing or substantially preventing leakage current from being generated by light in the thin-film transistor TL.

In some embodiments, the light-blocking pattern BML may be made of a material that blocks light and has conductivity. For example, the light-blocking pattern BML may include a single material of metals such as silicon (Ag), nickel (Ni), gold (Au), platinum (Pt), aluminum (Al), copper (Cu), molybdenum (Mo), titanium (Ti) and neodymium (Nd), or an alloy thereof. In some embodiments, the light-blocking pattern BML may be made up of a single layer or multi-layer structure. For example, when the light-blocking pattern BML is made up of a multilayer structure, the light-blocking pattern BML may be, but is not limited to, a stack structure of titanium (Ti)/copper (Cu)/indium tin oxide (ITO) or a stack structure of titanium (Ti)/copper (Cu)/aluminum oxide ($Al_2O_3$).

In some embodiments, a plurality of light-blocking patterns BML may be disposed. The number of the light-blocking patterns BML may be equal to the number of the semiconductor layers ACT. The light-blocking patterns BML may overlap the semiconductor layers ACT, respectively. In some embodiments, the width of the light-blocking patterns BML may be larger or greater than that of the semiconductor layers ACT.

In some embodiments, the light-blocking pattern BML may be a part of a data line, a voltage supply line, a line that connects (e.g., electrically connects) a thin-film transistor with the thin-film transistor TL shown in the drawing, etc. In some embodiments, the light-blocking pattern BML may be made of a material having a lower resistance than the second conductive layer or the source electrode SE and the drain electrode DE included in the second conductive layer.

A first insulating layer 113 may be disposed on the light-blocking pattern BML. In some embodiments, the first insulating layer 113 may be disposed in the display area DA and the non-display area NDA. The first insulating layer 113 may cover the light-blocking pattern BML. In some embodiments, the first insulating layer 113 may include an inorganic material such as $SiO_2$, $SiN_x$, SiON, $Al_2O_3$, $TiO_2$, $Ta_2O$, $HfO_2$ and $ZrO_2$.

The semiconductor layers ACT may be disposed on the first insulating layer 113. In some embodiments, the semiconductor layers ACT may be disposed in the first emission area LA1, the second emission area LA2 and the third emission area LA3 in the display area DA, respectively.

In some embodiments, the semiconductor layers ACT may include oxide semiconductor. For example, the semiconductor layers ACT may be made of Zn oxide, In—Zn oxide, Ga—In—Zn oxide, etc., as a Zn oxide-based material, and may be an IGZO (In—Ga—Zn—O) semiconductor containing a metal such as indium (In) and gallium (Ga) in ZnO. It is, however, to be understood that the present disclosure is not limited thereto. The semiconductor layers ACT may include amorphous silicon or polysilicon.

In some embodiments, the semiconductor layers ACT may be disposed to overlap the light-blocking patterns BML, respectively, thereby suppressing generation of photocurrent in the semiconductor layers ACT.

A first conductive layer may be disposed on the semiconductor layers ACT and may include a gate electrode GE, a first gate metal WR1, and a second gate metal WR2. The gate electrode GE may be disposed in the display area DA to overlap the respective semiconductor layer ACT. As shown in FIG. 12, the first gate metal WR1 may include a part of the line that connects (e.g., electrically connects) the connection pad PD (e.g., see FIG. 2) with the elements (e.g., the thin-film transistor TL and the light-emitting element, etc.) located in the display area DA (e.g., see FIG. 2).

The gate electrode GE and the first gate metal WR1 may include at least one of the materials including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and copper (Cu), and may be made up of a single layer or multiple layers, taking into account adhesion to adjacent layers, surface flatness for a layer to be laminated thereon, workability, etc.

In the display area DA, a gate insulating layer 115 may be disposed between the semiconductor layer ACT and the first conductive layer or between the semiconductor layer ACT and the gate electrode GE. In some embodiments, the gate electrode GE and the gate insulating layer 115 may work or function as a mask for masking a channel region of the semiconductor layer ACT, and the width of the gate electrode GE and the width of the gate insulating layer 115 may be smaller or less than the width of the semiconductor layer ACT.

In some embodiments, the gate insulating layer 115 may not be made up of a single layer disposed on the entire surface of the first base 110 but may be formed in a partially patterned shape. In some embodiments, the width of the gate insulating layer 115 may be larger or greater than the width of the gate electrode GE or the first conductive layer.

In some embodiments, the gate insulating layer 115 may include an inorganic material. For example, the gate insulating layer 115 may include the inorganic materials listed above as the materials that may be included in the first insulating layer 113.

In the non-display area NDA, the gate insulating layer 115 may be located between the first gate metal WR1 and the first insulating layer 113.

A second insulating layer 117 covering the semiconductor layer ACT and the gate electrode GE may be disposed over the gate insulating layer 115. The second insulating layer 117 may be located in the display area DA and the non-display area NDA. In some embodiments, the second insulating layer 117 may work or function as a planarization layer that provides a flat surface.

In some embodiments, the second insulating layer 117 may include an organic material. For example, the second insulating layer 117 may include, but is not limited to, at least one of: photo acryl (PAC), polystyrene, polymethyl methacrylate (PMMA), polyacrylonitrile (PAN), polyamide, polyimide, polyarylether, heterocyclic polymer, parylene, fluorine polymer, epoxy resin, benzocyclobutene series resin, siloxane series resin, and silane resin.

The second conductive layer may be disposed on the second insulating layer 117, and the second conductive layer may include the source electrode SE, the drain electrode DE, the voltage supply line VSL, and a first pad electrode PD1 of the connection pads PD.

The source electrode SE and the drain electrode DE may be disposed in the display area DA and may be spaced from (e.g., spaced apart from) each other.

The drain electrode DE and the source electrode SE may be connected to the semiconductor layer ACT through the second insulating layer 117.

In some embodiments, the source electrode SE may pass through the first insulating layer 113 and the second insulating layer 117 and may be connected to the light-blocking pattern BML. If the light-blocking pattern BML is a part of a line that transmits a signal or a voltage, the source electrode SE may be connected to and electrically coupled with the light-blocking pattern BML and may receive the voltage applied to the line. Alternatively, if the light-blocking pattern BML is a floating pattern rather than a separate line, a voltage applied to the source electrode SE and the like may be transmitted to the light-blocking pattern BML.

Alternatively, unlike the example shown in FIG. 9, the drain electrode DE may pass through the first insulating layer 113 and the second insulating layer 117 and may be connected to the light-blocking pattern BML. If the light-blocking pattern BML is not a line receiving a separate signal, a voltage applied to the drain electrode DE and the like may be transmitted to the light-blocking pattern BML.

The semiconductor layer ACT, the gate electrode GE, the source electrode SE and the drain electrode DE may form the thin-film transistor TL that is a switching element. In some embodiments, the thin-film transistor TL may be disposed in each of the first emission area LA1, the second emission area LA2 and the third emission area LA3. In some embodiments, a part of the thin-film transistor TL may be located in the non-emission area NLA.

The voltage supply line VSL may be located in the non-display area NDA. A supply voltage applied to a cathode electrode CE, for example, a voltage ELVSS may be supplied to the voltage supply line VSL.

The first pad electrode PD1 of the connection pads PD may be disposed in the pad area PDA (e.g., see FIG. 2) of the non-display area NDA. In some embodiments, the first pad electrode PD1 may pass through the second insulating layer 117 and may be connected (e.g., electrically connected) to a first wiring layer WR.

The source electrode SE, the drain electrode DE, the voltage supply line VSL and the first pad electrode PD1 of the connection pad PD may include aluminum (Al), copper (Cu), titanium (Ti), etc., and may be made up of multiple laser or a single layer. According to an embodiment of the present disclosure, the source electrode SE, the drain electrode DE, the voltage supply line VSL and the first pad electrode PD1 of the connection pad PD may be made up of a multilayer structure of Ti/Al/Ti.

A third insulating layer 130 may be disposed on the second insulating layer 117. The third insulating layer 130 may cover the thin-film transistor TL in the display area DA and may expose a part of the voltage supply line VSL in the non-display area NDA.

In some embodiments, the third insulating layer 130 may be a planarization layer. In some embodiments, the third insulating layer 130 may be made of an organic material. For example, the third insulating layer 130 may include an acrylic resin, an epoxy resin, an imide resin, an ester resin, etc. In some embodiments, the third insulating layer 130 may include a photosensitive organic material.

A first anode electrode AE1, a second anode electrode AE2 and a third anode electrode AE3 may be disposed on the third insulating layer 130 in the display area DA. In addition, a connection electrode CNE and a second pad electrode PD2 of the connection pad PD may be disposed on the third insulating layer 130 in the non-display area NDA.

The first anode electrode AE1 may overlap the first emission area LA1 and may be at least partially extended to the non-emission area NLA. For example, ends of the first anode electrode AE1 may be in the non-emission area NLA. The second anode electrode AE2 may overlap the second emission area LA2 and may be at least partially extended to the non-emission area NLA, and the third anode electrode AE3 may overlap the third emission area LA3 and may be at least partially extended to the non-emission area NLA. For example, ends of the second anode electrode AE2 may be in the non-emission area NLA, and ends of the third anode electrode AE3 may be in the non-emission area NLA. The first anode electrode AE1 may pass through the third insulating layer 130 and may be connected to the drain electrode DE of the thin-film transistor TL associated with the first anode electrode AE1. The second anode electrode AE2 may pass through the third insulating layer 130 and may be connected to the drain electrode DE of the thin-film transistor TL associated with the second anode electrode AE2. The third anode electrode AE3 may pass through the third insulating layer 130 and may be connected to the drain electrode DE of the thin-film transistor TL associated with the third anode electrode AE3.

In some embodiments, the first anode electrode AE1, the second anode electrode AE2 and the third anode electrode AE3 may be reflective electrodes. In such case, the first anode electrode AE1, the second anode electrode AE2 and the third anode electrode AE3 may be metal layers containing a metal such as Ag, Mg, Al, Pt, Pd, Au, Ni, Nd, Ir and Cr. In other embodiments, the first anode electrode AE1, the second anode electrode AE2 and the third anode electrode AE3 may further include a metal oxide layer stacked on the metal layer. In an embodiment, the first anode electrode AE1, the second anode electrode AE2 and the third anode electrode AE3 may have a multilayer structure (e.g., a two-layer structure of ITO/Ag, Ag/ITO, ITO/Mg and ITO/MgF, or a three-layer structure of ITO/Ag/ITO).

The connection electrode CNE may be connected (e.g., electrically connected) to the voltage supply line VSL in the non-display area NDA and may be in contact (e.g., direct contact) with the voltage supply line VSL.

The second pad electrode PD2 may be disposed on the first pad electrode PD1 in the non-display area NDA. The second pad electrode PD2 may be in contact (e.g., direct contact) with and connected (e.g., electrically connected) to the first pad electrode PD1.

In some embodiments, the connection electrode CNE and the second pad electrode PD2 may be made of the same material as the first anode electrode AE1, the second anode electrode AE2 and the third anode electrode AE3, and may be formed together (e.g., formed concurrently) with the first anode electrode AE1, the second anode electrode AE2 and the third anode electrode AE3 via the same fabrication process.

A pixel-defining layer 150 may be located on the first anode electrode AE1, the second anode electrode AE2, and the third anode electrode AE3. The pixel-defining layer 150 may include an opening for exposing the first anode electrode AE1, an opening for exposing the second anode electrode AE2, and an opening for exposing the third anode electrode AE3 and may define the light-emitting region LA1, the second light-emitting region LA2, the third light-emitting region LA3, and the non-light-emitting region NLA. That is to say, an exposed part of the first anode electrode AE1 which is not covered by the pixel-defining layer 150 may be the first light-emitting area LA1. Similarly, an exposed part of the second anode electrode AE2 which is not covered by the pixel-defining layer 150 may be the second light-emitting area LA2. An exposed part of the third anode electrode AE3 which is not covered by the pixel-defining layer 150 may be the third light-emitting area LA3. The pixel-defining layer 150 may be located in the non-emission area NLA.

In some embodiments, the pixel-defining layer 150 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

In some embodiments, the pixel-defining layer 150 may overlap a color pattern 250 and light-blocking pattern 260 to be described in more detail below.

In addition, in some embodiments, the pixel-defining layer 150 may overlap a bank pattern 370 to be described in more detail below.

As shown in FIGS. 9 and 12, an emissive layer OL may be disposed on the first anode electrode AE1, the second anode electrode AE2, and the third anode electrode AE3.

In some embodiments, the emissive layer OL may have the shape of a continuous film disposed across the plurality of emission areas LA1, LA2 and LA3 and the non-emission area NLA. Although the organic emissive layer OL is disposed only in the display area DA in the drawings, the organic emissive layer OL is not limited thereto. In some other embodiments, a part of the emissive layer OL may be located in the non-display area NDA. The emissive layer OL will be described in more detail below.

The cathode electrode CE may be disposed on the emissive layer OL. A part of the cathode electrode CE may be located in the non-display area NDA. The cathode electrode CE may be connected (e.g., electrically connected) to and in contact with the connection electrode CNE in the non-display area NDA. The supply voltage (e.g., the voltage ELVSS applied to the voltage supply line VSL) may be transmitted to the cathode electrode CE via the connection electrode CNE.

In some embodiments, the cathode electrode CE may be transflective or transmissive. If the cathode electrode CE is transflective, it may include Ag, Mg, Cu, Al, Pt, Pd, Au, Ni, Nd, Ir, Cr, Li, Ca, LiF/Ca, LiF/Al, Mo, Ti or a compound or a mixture thereof (e.g., a mixture of Ag and Mg). Further, if the thickness of the cathode electrode CE ranges from several tens to several hundred angstroms, the cathode electrode CE may be transflective.

When the cathode electrode CE is transmissive, the cathode electrode CE may include a transparent conductive oxide (TCO). For example, the cathode electrode CE may be formed of tungsten oxide ($W_xO_x$), titanium oxide ($TiO_2$), indium tin oxide (ITO), indium zinc oxide (IZO), zinc oxide (ZnO), indium tin zinc oxide MgO (magnesium oxide), etc.

In some embodiments, the cathode electrode CE may cover (e.g., completely cover) the emissive layer OL. In some embodiments, as shown in FIG. 12, the end of the cathode electrode CE may be located more to the outside than the end of the emissive layer OL, and the end of the emissive layer OL may be covered (e.g., completely covered) by the cathode electrode CE.

The first anode electrode AE1, the emissive layer OL and the cathode electrode CE may form a first light-emitting diode ED1, the second anode electrode AE2, the emissive layer OL and the cathode electrode CE may form a second light-emitting diode ED2, and the third anode electrode AE3, the emissive layer OL and the cathode electrode CE may form a third light-emitting diode ED3. Each of the first light-emitting diode ED1, the second light-emitting diode ED2 and the third light-emitting diode ED3 may emit exit light LE.

As shown in FIG. 10, the exit light LE finally emitted from the emissive layer OL may be a mixed light form a first component LE1 and a second component LE2. Each of the first component LE1 and the second component LE2 of the exit light LE may have a peak wavelength that is equal to or greater than approximately 440 nm and less than approximately 480 nm. That is to say, the exit light LE may be blue light.

As shown in FIG. 10, in some embodiments, the emissive layer OL may have a structure in which a plurality of emissive layers overlap one another (e.g., a tandem structure). For example, the emissive layer OL may include a first stack ST1 including the first emissive layer EML1, a second stack ST2 disposed on the first stack ST1 and including the second emissive layer EML2, a third stack ST3 disposed on the second stack ST2 and including the third emissive layer EML3, a first charge generation layer CGL1 disposed between the first stack ST1 and the second stack ST2, and a second charge generation layer CGL2 disposed between the second stack ST2 and the third stack ST3. The first stack ST1, the second stack ST2 and the third stack ST3 may overlap one another.

The first emission material layer EML1, the second emission material layer EML2 and the third emission material layer EML3 may overlap one another.

In some embodiments, the first emission material layer EML1, the second emission material layer EML2 and the third emission material layer EML3 may all emit light of the first color (e.g., blue light). For example, each of the first emission material layer EML1, the second emission material layer EML2 and the third emission material layer EML3 may be a blue emissive layer and may include an organic material.

In some embodiments, at least one of the first emission material layer EML1, the second emission material layer EML2 and the third emission material layer EML3 may emit first blue light having a first peak wavelength, and at least another one of the first emission material layer EML1, the second emission material layer EML2 and the third emission material layer EML3 may emit second blue light having a second peak wavelength different from the first peak wavelength. For example, one of the first emission material layer EML1, the second emission material layer EML2 and the third emission material layer EML3 may emit the first blue light having the first peak wavelength, and the other two of the first emission material layer EML1, the second emission material layer EML2 and the third emission material layer EML3 may emit the second blue light having the second peak wavelength. Specifically, the exit light LE finally emitted from the emissive layer OL may be mixed light of the first component LE1 and the second component LE2, and the first component LE1 may be the first blue light having the first peak wavelength, and the second component LE2 may be the second blue light having the second peak wavelength.

In some embodiments, the range of one of the first peak wavelength and the second peak wavelength may be equal to or greater than approximately 440 nm and less than approximately 460 nm, and the range of the other of the first peak wavelength and the second peak wavelength may be equal to or greater than approximately 460 nm and less than approximately 480 nm. It is, however, to be understood that the range of the first peak wavelength and the range of the second peak wavelength are not limited thereto. For example, the range of the first peak wavelength and the range of the second peak wavelength may both include approximately 460 nm. In some embodiments, one of the first blue light and the second blue light may be light of deep blue color, while the other of the first blue light and the second blue light may be light of sky blue color.

According to some embodiments, the exit light LE emitted from the emissive layer OL is blue light and may include a long-wavelength component and a short-wavelength component. Therefore, finally, the emissive layer OL may emit blue light having an emission peak broadly distributed as the exit light LE. In this manner, there is an advantage that color visibility can be improved at side viewing angles compared to an existing light-emitting element that emits blue light having a sharp emission peak.

In some embodiments, each of the first emission material layer EML1, the second emission material layer EML2 and the third emission material layer EML3 may include a host and dopant. The material of the host is not particularly limited herein and any suitable material may be used, for example, the material of the host may include Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2"-dimethyl-biphenyl), MADN(2-Methyl-9,10-bis(naphthalen-2-yl)anthracene), etc.

Each of the first emission material layer EML1, the second emission material layer EML2 and the third emission material layer EML3 that emits blue light may include a fluorescent material including one selected from the group consisting of: spiro-DPVBi, spiro-6P, DSB(distyryl-benzene), DSA(distyryl-arylene), PFO(polyfluorene) polymer and PPV (poly(p-phenylene vinylene) polymer. As another example, each of the first emission material layer EML1, the second emission material layer EML2 and the third emission material layer EML3 may include a phosphorescent material including an organometallic complex such as (4,6-F2ppy)2Irpic.

As described above, at least one of the first emission layer EML1, the second emission layer EML2 and the third emission layer EML3 may emit blue light in a different wavelength band from that of at least another one of the first emission layer EML1, the second emission layer EML2 and the third emission layer EML3. In order to emit blue light in different wavelength ranges, the first emission layer EML1, the second emission layer EML2 and the third emission layer EML3 may include the same material and the resonance distance may be adjusted. Alternatively, in order to emit blue light in different wavelength ranges, at least one of the first emission layer EML1, the second emission layer EML2 and the third emission layer EML3 and at least another one of the first emission layer EML1, the second emission layer EML2 and the third emission layer EML3 may include different materials from each other.

It is, however, to be understood that the present disclosure is not limited thereto. The blue light emitted by each of the first emission layer EML1, the second emission layer EML2 and the third emission layer EML3 all may have a peak wavelength of approximately 440 nm to approximately 480 nm, and may be made of the same material.

Alternatively, according to another embodiment, at least one of the first emission layer EML1, the second emission layer EML2 and the third emission layer EML3 may emit the first blue light having the first peak wavelength, another one of the first emission layer EML1, the second emission layer EML2 and the third emission layer EML3 may emit the second blue light having the second peak wavelength different from the first peak wavelength, and the other one of the first emission layer EML1, the second emission layer EML2 and the third emission layer EML3 may emit third blue light having a third peak wavelength different from the first peak wavelength and the second peak wavelength. In some other embodiments, the range of one of the first peak wavelength, the second peak wavelength and the third peak wavelength may be equal to or greater than approximately 440 nm and less than approximately 460 nm. The range of another one of the first peak wavelength, the second peak wavelength and the third peak wavelength may be equal to or greater than approximately 460 nm and less than approximately 470 nm. The range of the other one of the first peak wavelength, the second peak wavelength and the third peak wavelength may be equal to or greater than approximately 470 nm and less than approximately 480 nm.

According to some other embodiments, the exit light LE emitted from the emissive layer OL is blue light and may include a long-wavelength component, a medium-wavelength component, and a short-wavelength component. Therefore, finally, the emissive layer OL may emit blue light having an emission peak broadly distributed as the exiting light LE, and the color visibility at the side viewing angles can be improved.

The display devices according to the above-described embodiments have advantages over an existing light-emitting element that does not employ the tandem structure (i.e., the structure in which a number of light-emitting elements are stacked on one another in that the luminous efficiency can be increased and the lifetime of the display device can be improved).

Alternatively, according to some other embodiments, at least one of the first emission layer EML1, the second emission layer EML2 and the third emission layer EML3 may emit light of the third color (e.g., blue light), and at least another one of the first emission layer EML1, the second emission layer EML2 and the third emission layer EML3 may emit light of the third color (e.g., green light). In some other embodiments, the range of peak wavelength of blue light emitted by at least one of the first emission layer EML1, the second emission layer EML2 and the third emission layer EML3 may be from approximately 440 nm to approximately 480 nm, or from approximately 460 nm to approximately 480 nm. The green light emitted by at least another one of the first emission material layer EML1, the second emission material layer EML2 and the third emission material layer EML3 may have a peak wavelength in the range of approximately 510 nm to approximately 550 nm.

For example, one of the first emission material layer EML1, the second emission material layer EML2 and the third emission material layer EML3 may be a green emissive layer emitting green light, while the other two of the first emission material layer EML1, the second emission material layer EML2 and the third emission material layer EML3 may be blue emissive layers emitting blue light. When the other two of the first emission material layer EML1, the second emission material layer EML2 and the third emission material layer EML3 are blue emission material layers, the range of the peak wavelength of the blue light emitted by the two blue emission material layers may be equal to each other or different from each other.

According to some other embodiments, the exit light LE emitted from the emissive layer OL may be a mixed light of the first component LE1 which is blue light and the second component LE2 that is green light. For example, when the first component LE1 is deep blue light and the second component LE2 is green light, the exit light LE may be light having a sky blue color. Similar to the above-described embodiments, the exit light LE emitted from the emissive layer OL is a mixed light of blue light and green light, and includes a long-wavelength component and a short-wavelength component. Therefore, finally, the emissive layer OL may emit blue light having an emission peak broadly distributed as the exiting light LE, and the color visibility at the side viewing angles can be improved. In addition, because the second component LE2 of the exiting light LE is green light, green light component of the light provided from the display device 1 to the outside can be supplemented, and accordingly the color gamut of the display device 1 can be improved.

In some other embodiments, the green emissive layer of the first emission material layer EML1, the second emission material layer EML2 and the third emission material layer EML3 may include a host and dopant. The material of the host included in the green emission material layer is not particularly limited herein and any suitable material may be used, for example, the material of the host may include Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2"-dimethyl-biphenyl), MADN(2-Methyl-9,10-bis(naphthalen-2-yl)anthracene), etc.

The dopant included in the green emission material layer may include, for example, a fluorescent material such as Alq3(tris-(8-hydroyquinolato) aluminum(III)), or a phosphorescent material such as Ir(ppy)3(fac tris(2-phenylpyridine)iridium), Ir(ppy)2(acac)(Bis(2-phenylpyridine)(acetylacetonate)iridium(III)) and Ir(mpyp)3(2-phenyl-4-methylpyridine iridium).

The first charge generation layer CGL1 may be disposed between the first stack ST1 and the second stack ST2. The first charge generation layer CGL1 may serve to inject charges into each emission material layer EML. The first charge generation layer CGL1 may control charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11 and may be between the n-type charge generation layer CGL11 and the second stack ST2.

The first charge generation layer CGL1 may have a junction structure in which the n-type charge generation layer CGL11 and the p-type charge generation layer CGL12 are bonded with each other. The n-type charge generation layer CGL11 is disposed closer to the anode electrodes AE1, AE2 and AE3 than to the cathode electrode CE. The p-type charge generation layer CGL12 is disposed closer to the cathode electrode CE than to the anode electrodes AE1, AE2 and AE3. The n-type charge generation layer CGL11 supplies electrons to the first emission material layer EML1 adjacent to the anode electrodes AE1, AE2 and AE3, and the p-type charge generation layer CGL12 supplies holes to the second emission material layer EML2 included in the second stack ST2. By disposing the first charge generation layer CGL1 between the first stack ST1 and the second stack ST2, charges are applied to each of the emission material layers to increase the luminous efficiency and to lower the supply voltage.

The first stack ST1 may be disposed on the first anode electrode AE1, the second anode electrode AE2 and the third anode electrode AE3, and may further include a first hole transport layer HTL1, a first electron block layer BIL1 and a first electron transport layer ETL1.

The first hole transport layer HTL1 may be disposed on the first anode electrode AE1, the second anode electrode AE2 and the third anode electrode AE3. The first hole transport layer HTL1 may facilitate the transport of holes and may include a hole transport material. The hole transport material may include, but is not limited to, carbazole derivatives such as N-phenylcarbazole and polyvinylcarbazole, fluorene derivatives, triphenylamine derivatives such as TPD(N,N'-bis(3-methylphenyl)-N,N'-diphenyl-[1,1-biphenyl]-4,4'-diamine) and TCTA(4,4',4"-tris(N-carbazolyl)triphenylamine), NPB(N,N'-di(1-naphthyl)-N,N'-diphenylbenzidine), TAPC(4,4'-Cyclohexylidene bis[N,N-bis(4-methylphenyl)benzenamine]), etc.

The first electron block layer BIL1 may be disposed on the first hole transport layer HTL1 and may be located between the first hole transport layer HTL1 and the first emission material layer EML1. The first electron block layer BIL1 may include the hole transport material and a metal or a metal compound to prevent or substantially prevent the electrons generated in the first emission material layer EML1 from flowing into the first hole transport layer HTL1. In some embodiments, the first hole transport layer HTL1 and the first electron block layer BIL1 described above may be made up of a single layer where the materials are mixed.

The first electron transport layer ETL1 may be disposed on the first emission material layer EML1, and may be located between the first charge generation layer CGL1 and the first emission material layer EML1. In some embodiments, the first electron transport layer ETL1 may include electron transparent material such as Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate), ADN(9,10-di(naphthalene-2-yl)anthracene) and a mixture thereof. It is to be noted that the type of the electron transport material is not particularly limited herein. The second stack ST2 may be disposed on the first charge generation layer CGL1 and may further include a second hole transport layer HTL2, a second electron block layer BIL2 and a second electron transport layer ETL2.

The second hole transport layer HTL2 may be disposed on the first charge generation layer CGL1. The second hole transport layer HTL2 may be made of the same material as the first hole transport layer HTL1 or may include one or more materials selected from materials listed above as materials that may be included in the first hole transport layer HTL1. The second hole transport layer HTL2 may be made up of a single layer or multiple layers.

The second electron block layer BIL2 may be disposed on the second hole transport layer HTL2 and may be located between the second hole transport layer HTL2 and the first emission material layer EML2. The second electron block layer BIL2 may be made of the same material and the same structure as the first electron block layer BIL1 or may include one or more materials selected from materials listed above as the materials that may be included in the first electron block layer BIL1.

The second electron transport layer ETL2 may be disposed on the second emission material layer EML2, and may be located between the second charge generation layer CGL2 and the second emission material layer EML2. The second electron transport layer ETL2 may be made of the same material and the same structure as the first electron transport layer ETL1 or may include one or more materials selected from materials listed above as the materials that may be included in the first electron transport layer ETL1. The second electron transport layer ETL2 may be made up of a single layer or multiple layers.

The second charge generation layer CGL2 may be disposed on the second stack ST2 and may be located between the second stack ST2 and the third stack ST3.

The second charge generation layer CGL2 may have the same structure as the first charge generation layer CGL1 described above. For example, the second charge generation layer CGL2 may include an n-type charge generation layer CGL21 disposed closer to the second stack ST2 and a p-type charge generation layer CGL22 disposed closer to the cathode electrode CE. The p-type charge generation layer CGL22 may be disposed on the n-type charge generation layer CGL21.

The second charge generation layer CGL2 may have a junction structure between the n-type charge generation layer CGL21 and the p-type charge generation layer CGL22. The first charge general layer CGL1 and the second charge general layer CGL2 may be made of different materials from each other or may be made of the same material.

The second stack ST2 may be disposed on the second charge generation layer CGL2 and may further include a third hole transport layer HTL3 and a third electron transport layer ETL3.

The third hole transport layer HTL3 may be disposed on the second charge generation layer CGL2. The third hole transport layer HTL3 may be made of the same material as the first hole transport layer HTL1 or may include one or more materials selected from materials listed above as materials that may be included in the first hole transport layer HTL1. The third hole transport layer HTL3 may be made up of a single layer or multiple layers. When the third hole transport layer HTL3 is made up of multiple layers, the layers may include different materials from each other.

The third electron transport layer ETL3 may be disposed on the third emission material layer EML3, and may be located between the cathode electrode CE and the third emission material layer EML3. The third electron transport layer ETL3 may be made of the same material and the same structure as the first electron transport layer ETL1 or may include one or more materials selected from materials listed above as the materials that may be included in the first electron transport layer ETL1. The third electron transport layer ETL3 may be made up of a single layer or multiple layers. When the third electron transport layer ETL3 is made up of multiple layers, the layers may include different materials from each other.

In one or more embodiments, a hole injection layer may be further disposed between the first stack ST1 and the first anode electrode AE1, the second anode electrode AE2 and the third anode electrode AE3, between the second stack ST2 and the first charge generation layer CGL1, and/or between the third stack ST3 and the second charge generation layer CGL2. The hole injection layer may facilitate injection of holes into the first emission material layer EML1, the second emission material layer EML2 and the third emission material layer EML3. In some embodiments, the hole injection layer may be made of, but is not limited to, at least one selected from the group consisting of: CuPc (copper phthalocyanine), PEDOT (poly(3,4)-ethylenedioxythiophene), PANI (polyaniline) and NPD (N,N-dinaphthyl-N,N'-diphenyl benzidine). In some embodiments, the hole injection layer may be located between the first stack ST1 and the first anode electrode AE1, the second anode electrode AE2 and the third anode electrode, between the second stack ST2 and the first charge generation layer CGL1, and between the third stack ST3 and the second charge generation layer CGL2.

In one or more embodiments, an electron injection layer may be further disposed between the third electron transport layer ETL3 and the cathode electrode CE, between the second charge generation layer CGL2 and the second stack ST2, and/or between the first charge generation layer CGL1 and the first stack ST1. The electron injection layer facilitates the injection of electrons and may be made of, but is not limited to, Alq3(tris(8-hydroxyquinolino)aluminum), PBD, TAZ, spiro-PBD, BAlq or SAlq. In addition, the electron injection layer may be a metal halide compound and may be, but is not limited to, at least one selected from the group consisting of: $MgF_2$, LiF, NaF, KF, RbF, CsF, FrF, LiI, NaI, KI, RbI, CsI, FrI and $CaF_2$. In addition, the electron injection layer may include a lanthanide-series material such as Yb, Sm and Eu. Alternatively, the electron injection layer may include a metal halide material as well as a lanthanide material such as RbI:Yb and KI:Yb. When the electron injection layer includes both a metal halide material and a lanthanide material, the electron injection layer may be formed by co-deposition of the metal halide material and the lanthanide material. In some embodiments, the electron injection layer may be located between the third electron transport layer ETL3 and the cathode electrode CE, between the second charge generation layer CGL2 and the second stack ST2, and between the first charge generation layer CGL1 and the first stack ST1.

In addition to the above-described structure, the structure of the emissive layer OL may be altered. For example, the emissive layer OL may be modified like an emissive layer OLa shown in FIG. 11. Unlike the structure shown in FIG. 10, the emissive layer OLa shown in FIG. 11 may further include a fourth stack ST4 located between the third stack ST3 and the second stack ST2, and may further include a third charge generation layer CGL3 located between the third stack ST3 and the second stack ST2.

The fourth stack ST4 may include a fourth emission material layer EML4 and may further include a fourth hole transport layer HTL4, a third electron block layer BIL4, and a fourth electron transport layer ETL4.

The first emission material layer EML1, the second emission material layer EML2, the third emission material layer EML3 and the fourth emission material layer EML4 included in the emissive layer OL may all emit light of the first color (e.g., blue light). At least one of the first emission layer EML1, the second emission layer EML2 and the third emission layer EML3 and at least another one of the first emission layer EML1, the second emission layer EML2 and the third emission layer EML3 may emit blue light in different wavelength ranges.

Alternatively, at least one of the first emission layer EML1, the second emission layer EML2 and the third emission layer EML3 may emit green light, while at least another one of the first emission layer EML1, the second emission layer EML2 and the third emission layer EML3 may emit blue light. For example, one of the first emission material layer EML1, the second emission material layer EML2, the third emission material layer EML3 and the fourth emission material layer EML4 may be a green emission material layer, while the other three of the first emission material layer EML1, the second emission material layer EML2, the third emission material layer EML3 and the fourth emission material layer EML4 may be blue emission material layers.

The fourth hole transport layer HTL4 may be disposed on the second charge generation layer CGL2. The fourth hole transport layer HTL4 may be made of the same material as the first hole transport layer HTL1 or may include one or more materials selected from materials listed above as materials that may be included in the first hole transport layer HTL1. The fourth hole transport layer HTL4 may be made up of a single layer or multiple layers. When the fourth hole transport layer HTL4 is made up of multiple layers, the layers may include different materials from each other.

The third electron block layer BIL4 may be disposed on the fourth hole transport layer HTL4 and may be located between the fourth hole transport layer HTL4 and the fourth emission material layer EML4. The third electron block layer BIL4 may be made of the same material and the same structure as the first electron block layer BIL1 or may include one or more materials selected from materials listed above as the materials that may be included in the first electron block layer BIL1. In some other embodiments, the third electron block layer BIL4 may be eliminated or omitted.

The fourth electron transport layer ETL4 may be disposed on the fourth emission material layer EML4, and may be located between the through charge generation layer CGL3 and the fourth emission material layer EML4. The fourth electron transport layer ETL4 may be made of the same material and the same structure as the first electron transport layer ETL1 or may include one or more materials selected from materials listed above as the materials that may be included in the first electron transport layer ETL1. The fourth electron transport layer ETL4 may be made up of a single layer or multiple layers. When the fourth electron transport layer ETL4 is made up of multiple layers, the layers may include different materials from each other.

The third charge generation layer CGL3 may have the same structure as the first charge generation layer CGL1 described above. For example, the third charge generation layer CGL3 may include an n-type charge generation layer CGL31 disposed closer to the second stack ST2 and a p-type charge generation layer CGL22 disposed closer to the cathode electrode CE. The p-type charge generation layer CGL32 may be disposed on the n-type charge generation layer CGL31.

In one or more embodiments, the electron injection layer may be further disposed between the fourth stack ST4 and the third charge general layer CGL3. In addition, the hole injection layer may be further disposed between the fourth stack ST4 and the second charge general layer CGL2.

In some embodiments, both the emissive layer OL shown in FIG. 10 and the emissive layer OLa shown in FIG. 11 may not include a red light emissive layer and thus may not emit the light of the first color (e.g., red light). That is to say, the exiting light LE may not include an optical component having a peak wavelength in the range of approximately 610 nm to approximately 650 nm, and the exiting light LE may include only an optical component having a peak wavelength of approximately 440 nm to approximately 550 nm.

As shown in FIG. 12, the dam member DM may be positioned on the second insulating layer 117 in the non-display area NDA.

The dam member DM may be located more to the outside than the voltage supply line VSL. In other words, as shown in FIG. 12, the voltage supply line VSL may be located between the dam member DM and the display area DA.

In some embodiments, a part of the dam member DM may overlap the voltage supply line VSL.

In some embodiments, the dam member DM may include a plurality of dams. For example, the dam member DM may include a first dam D1 and a second dam D2.

The first dam D1 may partially overlap the voltage supply line VSL and may be spaced from (e.g., spaced apart from)

the third insulating layer 130 with the voltage supply line VSL interposed therebetween. In some embodiments, the first dam D1 may include a first lower dam pattern D11 located on the second insulating layer 117 and a first upper dam pattern D12 located on the first lower dam pattern D11.

The second dam D2 may be located on the outer side of the first dam D1 and may be spaced from (e.g., spaced apart from) the first dam D1. In some embodiments, the second dam D2 may include a second lower dam pattern D21 located on the second insulating layer 117 and a second upper dam pattern D22 located on the second lower dam pattern D21.

In some embodiments, the first lower dam pattern D11 and the second lower dam pattern D21 may be made of the same material as the third insulating layer 130 and may be formed together (e.g., formed concurrently) with the third insulating layer 130.

In some embodiments, the first upper dam pattern D12 and the second upper dam pattern D22 may be made of the same material as the pixel-defining layer 150 and may be formed together (e.g., formed concurrently) with the pixel-defining layer 150.

In some embodiments, the height of the first dam D1 may be different from the height of the second dam D2. For example, the height of the second dam D2 may be larger or greater than the height of the first dam D1. That is to say, the height of the dams included in the dam member DM may gradually increase away from the display area DA. Accordingly, it is possible to more effectively block an organic matter from overflowing during a process of forming an organic layer 173 included by an encapsulation layer 170, to be described in more detail below.

As shown in FIGS. 9 and 12, a first capping layer 160 may be disposed on the cathode electrode CE. The first capping layer 160 may be disposed across the first emission area LA1, the second emission area LA2, the third emission area LA3 and the non-emission area NLA, so that viewing angle characteristics can be improved and the out-coupling efficiency can be increased.

The first capping layer 160 may include an inorganic material and/or an organic material having light-transmitting properties. That is to say, the first capping layer 160 may be formed as an inorganic layer, or may be formed as an organic layer, or may be formed as an organic layer containing inorganic particles. For example, the first capping layer 160 may include a triamine derivative, a carbazole biphenyl derivative, an arylene diamine derivative, or a 8-hydroxy-quinoline-aluminum complex (Alq3).

In addition, the first capping layer 160 may be made of a mixture of a high-refractive material and a low-refractive material. Alternatively, the first capping layer 160 may include two layers having different refractive indices, for example, a high-refractive layer and a low-refractive layer.

In some embodiments, the first capping layer 160 may cover (e.g., completely cover) the cathode electrode CE. In some embodiments, as shown in FIG. 12, the end of the first capping layer 160 may be located more to the outside than the end of the cathode electrode CE, and the end of the cathode electrode CE may be covered (e.g., completely covered) by the first capping layer 160.

The encapsulation layer 170 may be disposed on the first capping layer 160. The encapsulation layer 170 protects elements, for example, the light-emitting elements ED1, ED2 and ED3 located under the encapsulation layer 170 from external foreign substances such as moisture. The encapsulation layer 170 is disposed (e.g., commonly disposed) across the first emission area LA1, the second emission area LA2, the third emission area LA3, and the non-emission area NLA. In some embodiments, the encapsulation layer 170 may cover (e.g., directly cover) the cathode electrode CE. In some embodiments, a capping layer covering the cathode electrode CE may be further disposed between the encapsulation layer 170 and the cathode electrode CE, in which case the encapsulation layer 170 may cover (e.g., directly cover) the capping layer. The encapsulation layer 170 may be a thin-film encapsulation layer.

In some embodiments, the encapsulation layer 170 may include a lower inorganic layer 171, an organic layer 173 and an upper inorganic layer 175 stacked (e.g., sequentially stacked) on the first capping layer 160.

In some embodiments, the lower inorganic layer 171 may cover the first light-emitting diode ED1, the second light-emitting device ED2 and the third light-emitting device ED3 in the display area DA. The lower inorganic layer 171 may cover the dam member DM in the non-display area NDA and may be extended to the outside of the dam member DM.

In some embodiments, the lower inorganic layer 171 may cover (e.g., completely cover) the first capping layer 160. In some embodiments, the end of the lower inorganic layer 171 may be located more to the outside than the end of the first capping layer 160, and the end of the first capping layer 160 may be covered (e.g., completely covered) by the lower inorganic layer 171.

The lower inorganic layer 171 may include a plurality of layers stacked on one another. The structure of the lower inorganic layer 171 will be described in more detail below.

The organic layer 173 may be disposed over the lower inorganic layer 171. The organic layer 173 may cover the first light-emitting diode ED1, the second light-emitting diode ED2 and the third light-emitting diode ED3 in the display area DA. In some embodiments, a part of the organic layer 173 may be located in the non-display area NDA but may not be located outside the dam member DM. Although a part of the organic layer 173 is located more to the inside (e.g., closer to the display area DA) than the first dam D1 is to the inside, the present disclosure is not limited thereto. In some other embodiments, a part of the organic layer 173 may be accommodated in a space between the first dam D1 and the second dam D2, and the end of the organic layer 173 may be located between the first dam D1 and the second dam D2.

The upper inorganic layer 175 may be disposed on the organic layer 173. The upper inorganic layer 175 may cover the organic layer 173. In some embodiments, the upper inorganic layer 175 may be in contact (e.g., direct contact) with the lower inorganic layer 171 in the non-display area NDA to form an inorganic/inorganic junction. In some embodiments, the end of the upper inorganic layer 175 and the end of the lower inorganic layer 171 may be substantially aligned with each other. The upper inorganic layer 175 may include a plurality of layers stacked on one another. The structure of the upper inorganic layer 175 will be described in more detail below.

Each of the lower inorganic layer 171 and the upper inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and the like.

In some embodiments, the organic layer 173 may be made of acrylic resin, methacrylic resin, polyisoprene, vinyl resin, epoxy resin, urethane resin, cellulose resin and perylene resin.

Hereinafter, the color conversion substrate 30 will be described in more detail with reference to FIGS. 13-17 in conjunction with FIGS. 1-12.

Figure 13:
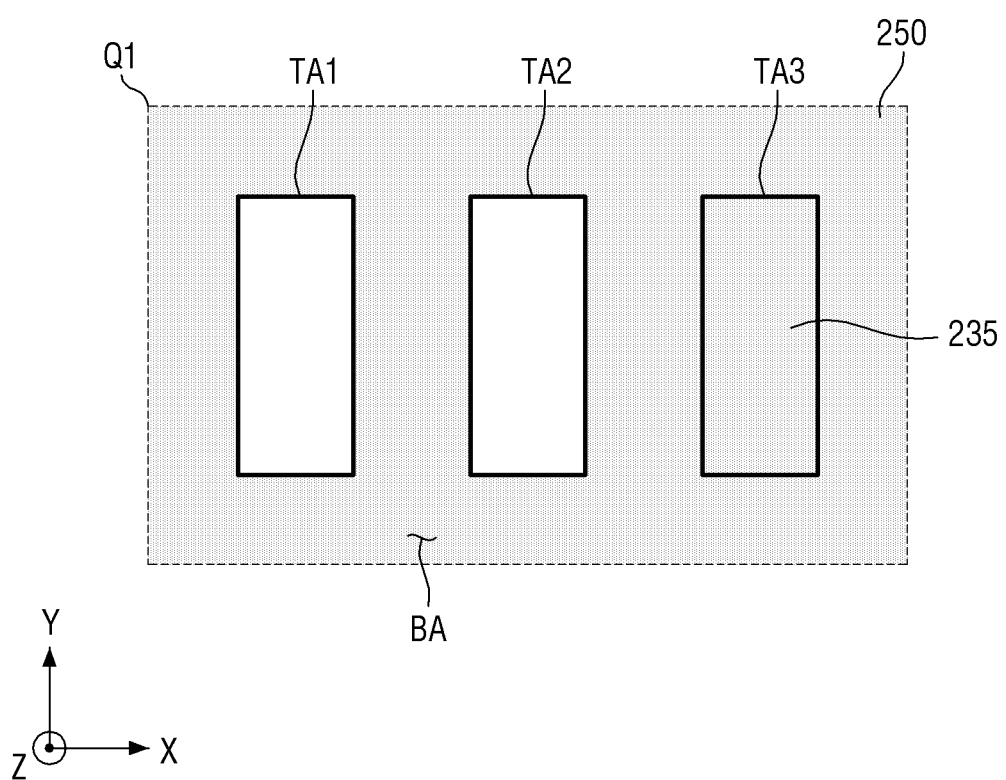
FIG. 13 is a plan view schematically showing a layout of a third color filter and a color pattern on a color conversion substrate of a display device according to an embodiment of the present disclosure.
Figure 14:
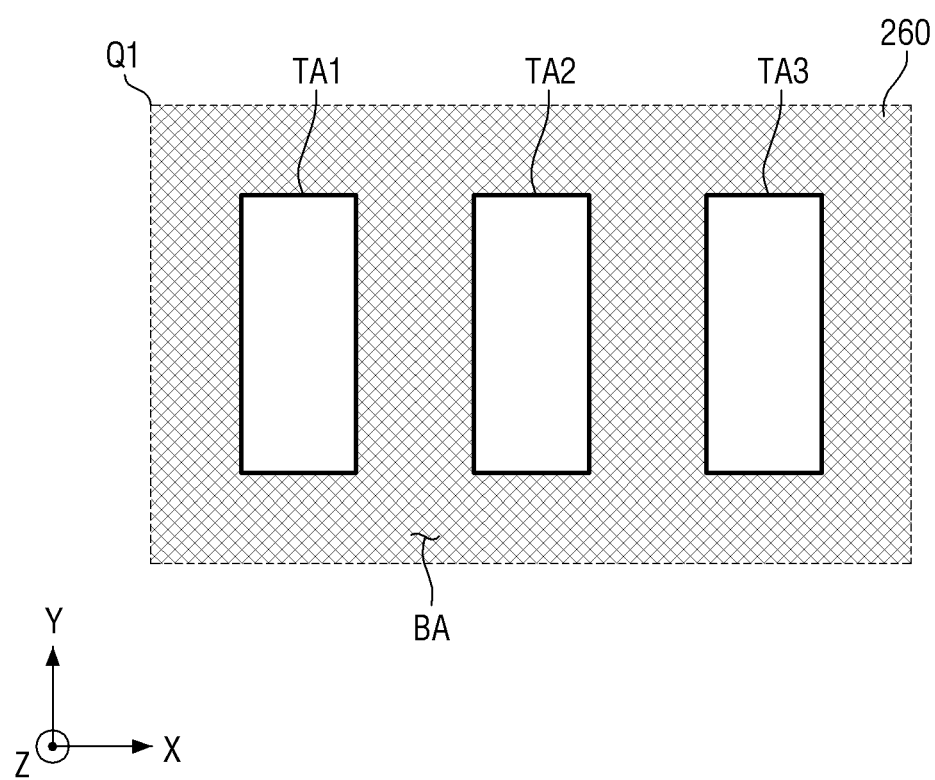
FIG. 14 is a plan view showing a layout of a light-blocking member on the color conversion substrate of the display device according to an embodiment of the present disclosure.
Figure 15:
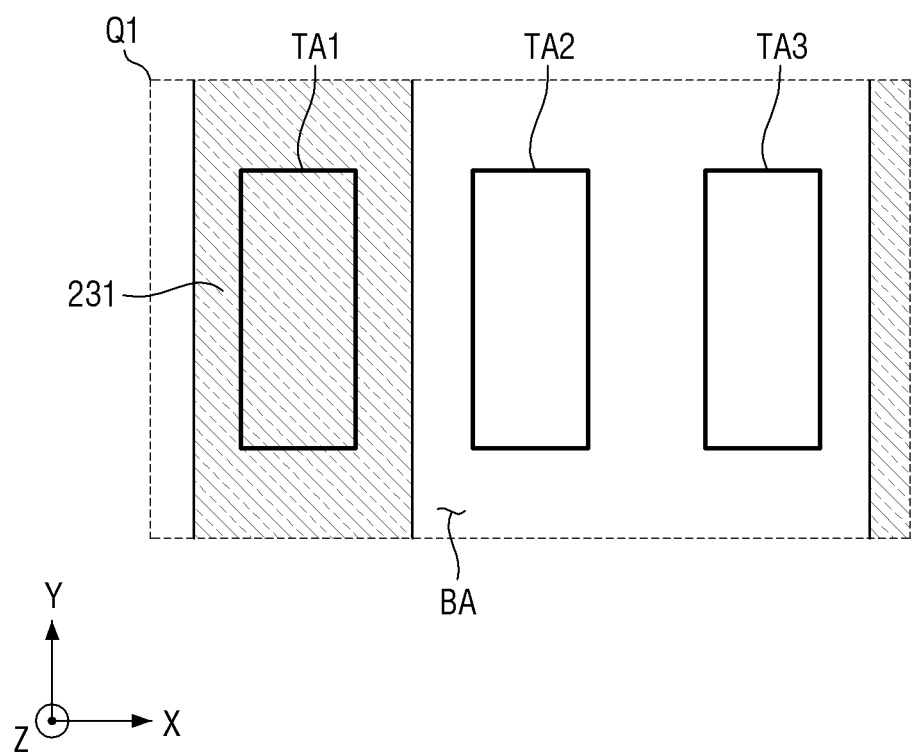
FIG. 15 is a plan view schematically showing a layout of a first color filter on a color conversion substrate of a display device according to an embodiment of the present disclosure.
Figure 16:
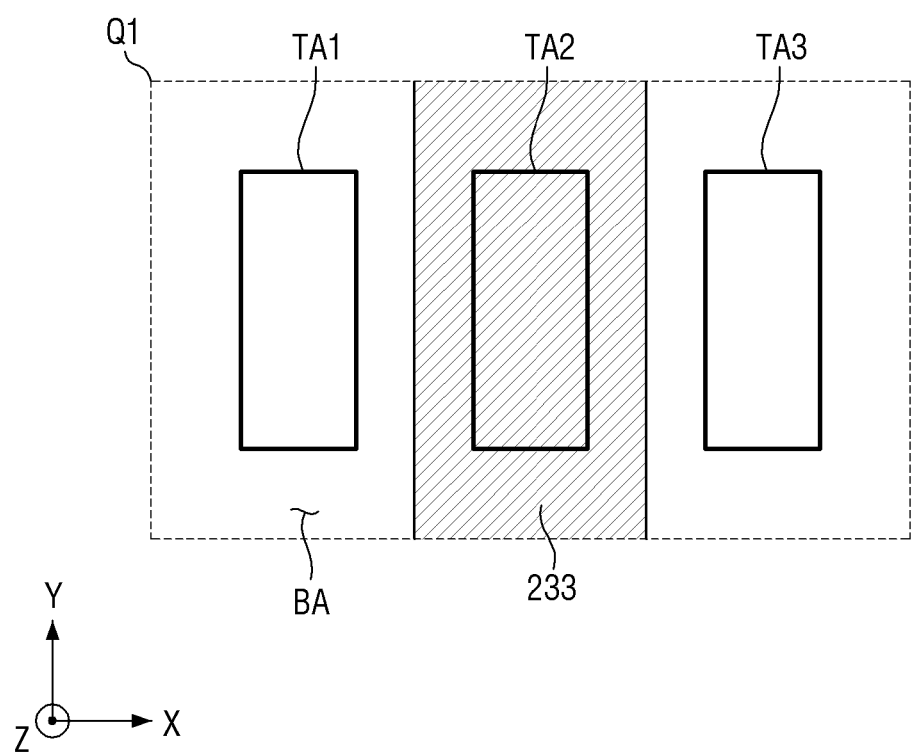
FIG. 16 is a plan view showing a layout of a second color filter on the color conversion substrate of the display device according to an embodiment of the present disclosure.
Figure 17:
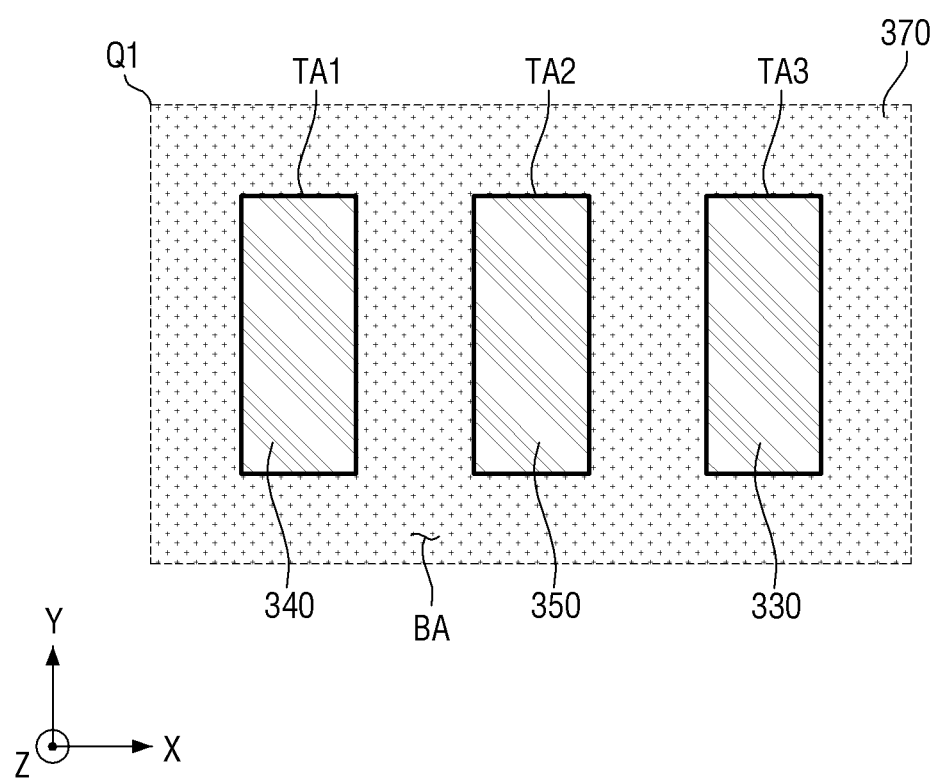
FIG. 17 is a plan view showing layouts of a bank pattern, a first wavelength conversion pattern, a second wavelength conversion pattern and a light-transmitting pattern in the color conversion substrate of the display device according to an embodiment of the present disclosure.

FIG. 13 is a plan view showing a layout of color filters and color patterns on a color conversion substrate of a display device according to an embodiment of the present disclosure. FIG. 14 is a plan view showing a layout of a light-blocking member on the color conversion substrate of the display device according to the embodiment of the present disclosure. FIG. 15 is a plan view schematically showing a layout of a first color filter on a color conversion substrate of a display device according to an embodiment of the present disclosure. FIG. 16 is a plan view schematically showing a layout of a second color filter on the color conversion substrate of the display device according to the embodiment of the present disclosure. FIG. 17 is a plan view showing layouts of a bank pattern, a first wavelength conversion pattern, a second wavelength conversion pattern and a light-transmitting pattern in the color conversion substrate of the display device according to the embodiment of the present disclosure.

A second base 310 shown in FIGS. 9 and 12 may be made of a light-transmitting material.

In some embodiments, the second base 310 may be a glass substrate or a plastic substrate. In some embodiments, the second base 310 may further include a separate layer (e.g., an insulating layer such as an inorganic film) disposed on the glass substrate or the plastic substrate.

In some embodiments, a plurality of light-transmitting areas TA1, TA2 and TA3 and a light-blocking area BA may be defined on the second base 310.

As shown in FIGS. 9 and 12, a third color filter 235 and a color pattern 250 may be located on a surface of the second base 310 facing the display substrate 10.

The third color filter 235 may be disposed to overlap the third emission area LA3 or the third light-transmitting area TA3.

The third color filter 235 may selectively transmit the light of the third color (e.g., blue light) while blocking or absorbing the light of the first color (e.g., red light) and the light of the second color (e.g., green light). In some embodiments, the third color filter 235 may be a blue color filter and may include a blue colorant such as a blue dye and a blue pigment. As used herein, a colorant encompasses a dye as well as a pigment.

The color pattern 250 may be disposed to overlap the non-emission area NLA or the light-blocking area BA. In addition, the color pattern 250 may be further located in the non-display area NDA.

The color pattern 250 can absorb a part of external light introduced into the display device 1 from the outside to thereby reduce the reflected light due to the external light. A substantial amount of external light is reflected to cause a problem that the color gamut of the display device 1 is distorted. In contrast, according to the embodiment of the present disclosure, by disposing the color pattern 250 in the non-emission area NLA and the non-display area NDA, it is possible to suppress color distortion caused by external light.

In some embodiments, the color pattern 250 may include a blue colorant, such as a blue dye or a blue pigment. In some embodiments, the color pattern 250 may be made of the same material as the third color filter 235 and may be formed together (e.g., formed concurrently) with the third color filter 235 via the process of forming the third color filter 235. When the color pattern 250 includes a blue colorant, the external light or the reflected light having passed through the color pattern 250 may be blue light. The eye color sensibility that a user's eyes perceive varies depending on the color of the light. More specifically, the light in the blue wavelength band may be perceived less sensitively to a user than the light in the green wavelength band and the light in the red wavelength band. Thus, as the color pattern 250 includes the blue colorant, the user can perceive the reflected light relatively less sensitively.

In some embodiments, as shown in FIG. 13, the color pattern 250 may be disposed throughout the light-blocking area BA. In addition, in some embodiments, as shown in FIG. 13, the color pattern 250 may be connected to the third color filter 235.

In some embodiments, the light-blocking pattern 260 may be located on a surface of the second base 310 facing the display substrate 10. The light-blocking pattern 260 may be disposed to overlap the light-blocking area BA to block transmission of light. In some embodiments, the light-blocking pattern 260 may be disposed in a substantially lattice form in a plan view or when viewed from the top as shown in FIG. 14.

In some embodiments, the light-blocking pattern 260 may include an organic light-blocking material and may be formed via processes of coating and exposing the organic light-blocking material.

As mentioned earlier, the external light may cause the problem that the color gamut of the display device 1 is distorted. In contrast, according to the embodiment of the present disclosure, by disposing the light-blocking pattern 260 over the second base 310, at least a part of the external light is absorbed by the light-blocking pattern 260. By doing so, it is possible to reduce color distortion due to the reflection of the external light. In some embodiments, the light-blocking pattern 260 can prevent or substantially prevent the color mixture occurring when light leaks between adjacent light-transmitting areas, thereby further improving the color gamut.

As shown in FIGS. 9 and 12, the light-blocking pattern 260 may be located on the color pattern 250. In other words, the light-blocking pattern 260 may be located on or at the opposite side of the second base 310 with the color pattern 250 interposed therebetween.

As the color pattern 250 is located between the light-blocking pattern 260 and the second base 310, in some embodiments, the light-blocking pattern 260 may not be in contact with the second base 310.

In another embodiment, the light-blocking pattern 260 may be eliminated or omitted.

As shown in FIG. 9, a first color filter 231 and a second color filter 233 may be located on a surface of the second base 310 facing the display substrate 10.

The first color filter 231 may be disposed to overlap the first emission area LA1 or the first light-transmitting area TA1, and the second color filter 233 may be disposed to overlap the second emission area LA2 or the second light-transmitting area TA2.

In some embodiments, the first color filter 231 may block or absorb light of the third color (e.g., blue light). That is to say, the first color filter 231 may work or function as a blue-light-blocking filter for blocking or substantially blocking blue light. In some embodiments, the first color filter 231 may selectively transmit the light of the first color (e.g., red light) while blocking or absorbing the light of the third color (e.g., blue light) and the light of the second color (e.g., green light). For example, the first color filter 231 may be a red color filter and may include a red colorant.

The second color filter 233 may block or absorb light of the third color (e.g., blue light). That is to say, the second color filter 233 may also work as a blue-light-blocking filter. In some embodiments, the second color filter 233 may selectively transmit the light of the second color (e.g., green light) while blocking or absorbing the light of the third color (e.g., blue light) and the light of the first color (e.g., red light). For example, the second color filter 233 may be a green color filter and may include a green colorant.

As shown in FIGS. 9 and 15, in some embodiments, a part of the first color filter 231 may be located within the light-blocking area BA, and a part of the second color filter 233 may also be located within the light-blocking area BA as shown in FIGS. 9 and 16.

In some embodiments, a part of the first color filter 231 may be located at a portion of the light-blocking area BA between the first light-transmitting area TA1 and the second light-transmitting area TA2 and a portion between the first light-transmitting area TA1 and the third light-transmitting area TA3.

In some embodiments, a part of the second color filter 233 may be located at a portion of the light-blocking area BA between the first light-transmitting area TA1 and the second light-transmitting area TA2 and a portion of between the second light-transmitting area TA2 and the third light-transmitting area TA3.

Although the first color filter 231 and the second color filter 233 do not overlap with each other in the drawing, the first color filter 231 and the second color filter 233 may overlap with each other in the light-blocking area BA between the first light-transmitting area TA1 and the second light-transmitting area TA2. The portion of the first color filter 231 and the portion of the second color filter 233 overlapping each other in the light-blocking area BA may work or function as a light-blocking member that blocks transmission of light.

Alternatively, according to another embodiment, the first color filter 231 and the second color filter 233 may be located throughout the entire light-blocking area BA, and the first color filter 231 and the second color filters 233 may overlap each other in the entire light-blocking area BA.

In some embodiments, the first color filter 231 and the second color filter 233 may overlap the color pattern 250 in the light-blocking area BA. For example, the color pattern 250 may overlap the first color filter 231 and the second color filter 233 in the portion of the light-blocking area BA between the first light-transmitting area TA1 and the second light-transmitting area TA2. In addition, the color pattern 250 may overlap the second color filter 233 in the light-blocking area BA between the second light-transmitting area TA2 and the third light-transmitting area TA3. In addition, the color pattern 250 may overlap the first color filter 231 in the light-blocking area BA between the third light-transmitting area TA3 and the first light-transmitting area TA1.

The portion of the first color filter 231 and the portion of the color pattern 250 overlapping each other in light-blocking area BA, and the portion of the second color filter 233 and the portion of the color pattern 250 overlapping each other in light-blocking area BA may work or function as light-blocking members. The portion of the first color filter 231 and the portion of the color pattern 250 overlapping each other in light-blocking area BA, and the portion of the second color filter 233 and the portion of the color pattern 250 overlapping each other in light-blocking area BA can absorb at least a part of the external light to reduce distortion of colors due to the reflection of the external light. In addition, it is possible to prevent or substantially prevent the light exiting to the outside from intruding into or passing through adjacent emission areas to cause color mixing, and thus the color gamut of the display device 1 can be further improved.

In some embodiments, at least one of the first color filter 231 and the second color filter 233 may be further located in the non-display area NDA. For example, as shown in FIGS. 12 and 13, the first color filter 231 may be further located in the non-display area NDA and may overlap the color pattern 250 in the non-display area NDA. The color pattern 250 and the first color filter 231 overlapping each other may work or function as a light-blocking member in the non-display area NDA. When the light-blocking pattern 260 is eliminated or omitted, the first color filter 231 may be located on (e.g., directly on) the color pattern 250 in the non-display area NDA.

As shown in FIGS. 9 and 12, a second capping layer 391 may be located on one surface of the second base 310, which covers the light-blocking pattern 260, the color pattern 250, the first color filter 231, the second color filter 233 and the third color filter 235. In some embodiments, the second capping layer 391 may be in contact (e.g., direct contact) with the first color filter 231, the second color filter 233, and the third color filter 235. In addition, in some embodiments, the second capping layer 391 may be in contact (e.g., direct contact) with the light-blocking pattern 260.

The second capping layer 391 can prevent or substantially prevent the light-blocking pattern 260, the color pattern 250, the first color filter 231, the second color filter 233 and the third color filter 235 from being damaged or contaminated by impurities such as moisture and air introduced from the outside. In addition, the second capping layer 391 can prevent or substantially prevent the colorant contained in the first color filter 231, the second color filter 233 and the third color filter 235 from diffusing into other elements (e.g., the first wavelength conversion pattern 340, the second wavelength conversion pattern 350, etc.). In some embodiments, the second capping layer 391 may be made of an inorganic material. For example, the second capping layer 391 may be made of a material including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

In some embodiments, the second capping layer 391 may cover side surfaces of the color pattern 250, the light-blocking pattern 260, and the first color filter 231 in the non-display area NDA. In addition, in some embodiments, the second capping layer 391 may be in contact (e.g., direct contact) with the second base 310 in the non-display area NDA.

The bank pattern 370 may be disposed on the surface of the second capping layer 391 facing the display substrate 10. In some embodiments, the bank pattern 370 may be located on (e.g., directly on) the surface of the second capping layer 391 and may be in contact (e.g., direct contact) with the second capping layer 391.

In some embodiments, the bank pattern 370 may be disposed to overlap the non-emission area NLA or the light-blocking area BA. In some embodiments, the bank pattern 370 may surround the first light-transmitting area TA1, the second light-transmitting area TA2 and the third light-transmitting area TA3 in a plan view or when viewed from the top as shown in FIG. 17. The bank pattern 370 may define the space where each of the first wavelength conversion pattern 340, the second wavelength conversion pattern 350 and a light-transmitting pattern 330 is disposed. For example, the bank pattern 370 may surround each of the first wavelength conversion pattern 340, the second wavelength conversion pattern 350 and a light-transmitting pattern 330.

In some embodiments, the bank pattern 370 may be implemented as a single pattern which is a single piece as shown in FIG. 17, but the present disclosure is not limited thereto. According to another embodiment, a part of the bank pattern 370 surrounding the first light-transmitting area TA1, a part of the bank pattern 370 surrounding the second light-transmitting area TA2, and a part of the bank pattern 370 surrounding the third light-transmitting area TA3 may be formed as separate patterns spaced from (e.g., spaced apart from) one another.

When the first wavelength conversion pattern 340, the second wavelength conversion pattern 350 and the light-transmitting pattern 330 are formed by ejecting an ink composition using a nozzle (i.e., formed by inkjet printing) or the like, the bank pattern 370 may work or function as a guide to stably position the ejected ink composition at desired or suitable positions. In other words, the bank pattern 370 may work or function as a partition wall.

In some embodiments, the bank pattern 370 may overlap the pixel-defining layer 150.

As shown in FIG. 12, in some embodiments, the bank pattern 370 may be further located in the non-display area NDA. The bank pattern 370 may overlap the color pattern 250 and the first color filter 231 in the non-display area NDA.

In some embodiments, the bank pattern 370 may include an organic material that is photo-curable. In addition, in some embodiments, the bank pattern 370 may include an organic material that is photo-curable and contains a light-blocking material. When the bank pattern 370 has light-blocking properties, it is possible to prevent or substantially prevent light from intruding into or passing through adjacent emission areas in the display area DA. For example, the bank pattern 370 can prevent or substantially prevent the exiting light LE emitted from the second light-emitting diode ED2 from entering the first wavelength conversion pattern 340 overlapping the first emission area LA1. In addition, the bank pattern 370 can block or suppress external light from intruding into the elements disposed under the bank pattern 370 in the non-emission area NLA and the non-display area NDA.

As shown in FIGS. 9 and 12, the first wavelength conversion pattern 340, the second wavelength conversion pattern 350 and the light-transmitting pattern 330 may be located on the second capping layer 391. In some embodiments, the first wavelength conversion pattern 340, the second wavelength conversion pattern 350 and the light-transmitting pattern 330 may be located in the display area DA.

The light-transmitting pattern 330 may overlap the third emission area LA3 or the third light-emitting diode ED3. The light-transmitting pattern 330 may be located in the space defined by the bank pattern 370 in the third light-transmitting area TA3.

In some embodiments, the light-transmitting pattern 330 may be formed in an island shape pattern as shown in FIG. 17. Although the light-transmitting pattern 330 does not overlap with the light-blocking area BA in the drawings, this is merely illustrative. In some other embodiments, a part of the light-transmitting pattern 330 may overlap the light-blocking area BA.

The light-transmitting pattern 330 can transmit incident light. In other words, light incident on the light-transmitting pattern 330 may pass through the light-transmitting pattern 330. The exiting light LE provided from the light-emitting diode ED3 may be blue light as described above. The exiting light LE, which is blue light, passes through the light-transmitting pattern 330 and the third color filter 235 and exits to the outside of the display device 1. That is to say, third light LO3 emitted from the third emission area LA3 to the outside of the display device 1 may be blue light.

In some embodiments, the light-transmitting pattern 330 may further include a first base resin 331 and may further include first scatterers 333 dispersed in the first base resin 331.

The first base resin 331 may be made of a material having a high light transmittance. In some embodiments, the first base resin 331 may be made of an organic material. For example, the first base resin 331 may include an organic material such as an epoxy resin, an acrylic resin, a cardo resin, or an imide resin.

The first scatterers 333 may have a refractive index different from that of the first base resin 331 and may form an optical interface with the first base resin 331. For example, the first scatterers 333 may be light scattering particles. The material of the first scatterers 333 is not particularly limited, for example, any suitable material may be used for the first scatterers 333 as long as the first scatterers 333 can scatter at least a part of the transmitted light. For example, the scatterers 450 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include acrylic resins, urethane resins, etc. The first scatterers 333 can scatter light in random directions regardless of the direction in which the incident light is coming, without substantially changing the wavelength of the light transmitted through the light-transmission pattern 330.

In some embodiments, the light-transmitting pattern 330 may be in contact (e.g., direct contact) with the second capping layer 391 and the bank pattern 370.

The first wavelength conversion pattern 340 may be located on the second capping layer 391 and may overlap the first emission area LA1, the first light-emitting diode ED1 or the first light-transmitting area TA1.

In some embodiments, the first wavelength conversion pattern 340 may be located in a space defined by the bank pattern 370 in the first light-transmitting area TA1.

In some embodiments, the first wavelength conversion pattern 340 may be formed in an island shape pattern as shown in FIG. 17. Although the first wavelength conversion pattern 340 does not overlap the light-blocking area BA of the first wavelength conversion pattern 340 in the drawings, the present disclosure is not limited thereto. In some other embodiments, a part of the first wavelength conversion pattern 340 may overlap the light-blocking area BA.

In some embodiments, the first wavelength conversion pattern 340 may be in contact (e.g., direct contact) with the second capping layer 391 and the bank pattern 370.

The first wavelength conversion pattern 340 may convert or shift the peak wavelength of the incident light into light of another peak wavelength. In some embodiments, the first wavelength conversion pattern 340 may convert the exiting light LE provided from the first light-emitting diode ED1 into red light having a peak wavelength in the range of approximately 610 nm to approximately 650 nm.

In some embodiments, the first wavelength conversion pattern 340 may include a second base resin 341 and first wavelength shifters 345 dispersed in the second base resin 341, and may further include second scatterers 343 dispersed in the second base resin 341.

The second base resin 341 may be made of a material having a high light transmittance. In some embodiments, the second base resin 341 may be made of an organic material. In some embodiments, the second base resin 341 may be made of the same material as the first base resin 331, or may include at least one of the materials listed above as the examples of the constituent materials of the first base resin 331.

The first wavelength shifters 345 may convert or shift the peak wavelength of the incident light to another peak wavelength. In some embodiments, the first wavelength shifters 345 may convert the exiting light LE of the third color, which is the blue light provided from the first light-emitting diode ED1, into red light having a single peak wavelength in the range of approximately 610 nm to approximately 650 nm.

Examples of the first wavelength shifters 345 may include quantum dots, quantum rods or phosphors. For example, quantum dots may be particulate matter that emits a color as electrons transition from the conduction band to the valence band.

The quantum dots may be semiconductor nanocrystalline material. The quantum dots have a specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

The group II-VI compounds may be selected from the group consisting of: binary compounds selected from the group consisting of CdSe, CdTe, ZnS, ZnSe, ZnTe, ZnO, HgS, HgSe, HgTe, MgSe, MgS and a mixture thereof; ternary compounds selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The group III-V compounds may be selected from the group consisting of: binary compounds selected from the group consisting of GaN, GaP, GaAs, GaSb, AlN, AlP, AlAs, AlSb, InN, InP, InAs, InSb and a mixture thereof; ternary compounds selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and a mixture thereof; and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof.

The group IV-VI compounds may be selected from the group consisting of: binary compounds selected from the group consisting of SnS, SnSe, SnTe, PbS, PbSe, PbTe and a mixture thereof; ternary compounds selected from the group consisting of SnSeS, SnSeTe, SnSTe, PbSeS, PbSeTe, PbSTe, SnPbS, SnPbSe, SnPbTe and a mixture thereof; and quaternary compounds selected from the group consisting of SnPbSSe, SnPbSeTe, SnPbSTe and a mixture thereof. The group IV elements may be selected from the group consisting of Si, Ge and a mixture thereof. The group IV compounds may be binary compounds selected from the group consisting of SiC, SiGe and a mixture thereof.

The binary compounds, the ternary compounds or the quaternary compounds may be present in the particles at a uniform or substantially uniform concentration, or may be present in the same particles at partially different concentrations. In addition, they may have a core/shell structure in which one quantum dot surrounds another quantum dot. At the interface between the core and the shell, the gradient of the concentrate of atoms in the shell may decrease toward the center.

In some embodiments, the quantum dots may have a core-shell structure including a core comprising the nanocrystals and a shell surrounding the core. The shell of the quantum-dots may serve as a protective layer for maintaining the semiconductor properties by preventing or reducing chemical denaturation of the core and/or as a charging layer for imparting electrophoretic properties to the quantum dots. The shell may be either a single layer or multiple layers. At the interface between the core and the shell, the gradient of the concentrate of atoms in the shell may decrease toward the center. Examples of the shell of the quantum dot may include an oxide of a metal or a non-metal, a semiconductor compound, a combination thereof, etc.

For example, examples of the metal or non-metal oxide may include, but is not limited to, binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$ or ternary compounds such as $MgAl_2O_4$, $CoFe_2O_4$, $NiFe_2O_4$ and $CoMn_2O_4$.

Examples of the semiconductor compound may include, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc.

The light output from the first wavelength shifters 345 may have a full width of half maximum (FWHM) of the emission wavelength spectrum of approximately 45 nm or less, approximately 40 nm or less, or approximately 30 nm or less. In this manner, the color purity and color gamut of the colors displayed by the display device 1 can be further improved. In addition, the light output from the first wavelength shifters 345 may travel in different directions regardless of the incidence direction of the incident light. In this manner, the side visibility of the first color displayed in the first light-transmitting area TA1 can be improved.

A part of the exiting light LE provided from the first light-emitting diode ED1 may not be converted into red light by the first wavelength shifters 345 but may pass through the first wavelength conversion pattern 340. Components of the exiting light LE which are not converted by the first wavelength conversion pattern 340 but are incident on the first color filter 231 may be blocked by the first color filter 231. On the other hand, red light that is converted from the exiting light LE by the first wavelength conversion pattern 340 passes through the first color filter 231 to exit to the outside. That is to say, first light LO1 exiting to the outside of display device 1 through the first light-transmitting area TA1 may be red light.

The second scatterers 343 may have a refractive index different from that of the second base resin 341 and may form an optical interface with the second base resin 341. For example, the second scatterers 343 may be light scattering particles. The second scatterers 343 are substantially identical to the first scatterers 333 described above; and, therefore, a redundant description may not be repeated.

The second wavelength conversion pattern 350 may be located in the space defined by the bank pattern 370 in the second light-transmitting area TA2, In some embodiments, the second wavelength conversion pattern 350 may be formed in an island shape pattern as shown in FIG. 17. In some other embodiments, a part of the second wavelength conversion pattern 350 may overlap the light-blocking area BA, unlike that shown in the drawings.

In some embodiments, the second wavelength conversion pattern 350 may be in contact (e.g., direct contact) with the second capping layer 391 and the bank pattern 370.

The second wavelength conversion pattern 350 may convert or shift the peak wavelength of the incident light into light of another peak wavelength and emit the light. In some embodiments, the second wavelength conversion pattern 350 may convert the exiting light LE provided from the second light-emitting diode ED2 into green light in the range of approximately 510 to approximately 550 nm.

In some embodiments, the second wavelength conversion pattern 350 may include a third base resin 351 and second wavelength shifters 355 dispersed in the third base resin 351, and may further include third scatterers 353 dispersed in the third base resin 351.

The third base resin 351 may be made of a material having a high light transmittance. In some embodiments, the third base resin 351 may be made of an organic material. In some embodiments, the third base resin 351 may be made of the same material as the first base resin 331, or may include at least one of the materials listed above as the examples of the constituent materials of the first base resin 331.

The second wavelength shifters 355 may convert or shift the peak wavelength of the incident light to another peak wavelength. In some embodiments, the second wavelength shifters 355 may convert blue light having a peak wavelength in the range of approximately 440 nm to approximately 480 nm into green light having a peak wavelength in the range of approximately 510 nm to approximately 550 nm.

Examples of the second wavelength shifters 355 may include quantum dots, quantum rods or phosphors. The second wavelength shifters 355 are substantially identical to the first wavelength shifters 345; and, therefore, a redundant description may not be repeated.

In some embodiments, the first wavelength shifters 345 and the second wavelength shifters 355 may all be made up of quantum dots. In such case, the particle size of the quantum dots forming the second wavelength shifters 355 may be smaller than the particle size of the quantum dots forming the first wavelength shifters 345.

The third scatterers 353 may have a refractive index different from that of the third base resin 351 and may form an optical interface with the third base resin 351. For example, the third scatterers 353 may be light scattering particles. The third scatterers 353 are substantially identical to the second scatterers 343 described above; and, therefore, a redundant description may not be repeated.

The exiting light LE emitted from the third light-emitting diode ED2 may be provided to the second wavelength conversion pattern 350. The second wavelength shifters 355 may convert the exiting light LE provided from the third light-emitting diode ED3 into green light having a peak wavelength in the range of approximately 510 nm to approximately 550 nm.

A part of the exiting light LE, which is blue light, may not be converted into green light by the second wavelength shifters 355 but may pass through the second wavelength conversion pattern 350, which may be blocked by the second color filter 223. On the other hand, green light that is converted from the exiting light LE by the second wavelength conversion pattern 350 passes through the second color filter 233 to exit to the outside. Accordingly, second light LO2 exiting to the outside of the display device 1 from the second light-transmitting area TA2 may be green light.

A third capping layer 393 may be located on the bank pattern 370, the light-transmitting pattern 330, the first wavelength conversion pattern 340 and the second wavelength conversion pattern 350. The third capping layer 393 may cover the light-transmission pattern 330, the first wavelength conversion pattern 340 and the second wavelength conversion pattern 350. In some embodiments, the third capping layer 393 may be located in the non-display area NDA as well. In the non-display area NDA (e.g., see FIG. 1), the third capping layer 393 may be in contact (e.g., direct contact) with the second capping layer 391 and can seal the light-transmitting pattern 330, the first wavelength conversion pattern 340 and the second wavelength conversion pattern 350. Thus, it is possible to prevent or substantially prevent impurities such as moisture and air from permeating from the outside to damage or contaminate the light-transmission pattern 330, the first wavelength conversion pattern 340 and the second wavelength conversion pattern 350.

In some embodiments, the third capping layer 393 may cover the outer surfaces of the bank pattern 370 in the non-display area NDA. In addition, the third capping layer 393 may be in contact (e.g., direct contact) with the second capping layer 391 in the non-display area NDA.

In some embodiments, the third capping layer 393 may be made of an inorganic material. In some embodiments, the third capping layer 393 may be made of the same material as the second capping layer 391 or may include at least one of those listed above as the materials that may be included in the second capping layer 391. When both the second capping layer 391 and the third capping layer 393 are made of an inorganic material, in the non-display area NDA, the second capping layer 391 and the third capping layer 393 may be in contact (e.g., direct contact) with each other to form an inorganic/inorganic junction.

As described above, in the non-display area NDA, the sealing member 50 may be located between the color conversion substrate 30 and the display substrate 10.

The sealing member 50 may overlap the encapsulation layer 170. More specifically, the sealing member 50 may overlap the lower inorganic layer 171 and the upper inorganic layer 175 and may not be overlap the organic layer 173. In some embodiments, the sealing member 50 may be in contact (e.g., direct contact) with the encapsulation layer 170. More specifically, the sealing member 50 may be located on (e.g., directly on) the upper inorganic layer 175 and may be in contact (e.g., direct contact) with the upper inorganic layer 175.

In some embodiments, the upper inorganic layer 175 and the lower inorganic layer 171 disposed under the sealing member 50 may be extended to the outside of the sealing member 50. The end of the upper inorganic layer 175 and the end of the lower inorganic layer 171 may be located between the sealing member 50 and a first part of the first support member and between the sealing member 50 and a second part of the first support member.

The sealing member 50 may overlap the color pattern 250, the first color filter 231 and the bank pattern 370 in the non-display area NDA. In some embodiments, the sealing member 50 may be in contact (e.g., direct contact) with the third capping layer 393 covering the bank pattern 370.

The sealing member 50 may overlap the first gate metal WR1 including lines connected to the connection pads PD.

As the sealing member 50 is disposed to overlap the first gate metal WR1, the width of the non-display area NDA can be reduced.

The filler 70 may be located in the space defined by the color conversion substrate 30, the display substrate 10 and the sealing member 50, as described above. In some embodiments, the filler 70 may be in contact with the third capping layer 393 and the upper inorganic layer 175 of the encapsulation layer 170, as shown in FIGS. 9 and 12.

Hereinafter, the structure of the above-described encapsulation layer 170 will be described in more detail.

Figure 18:
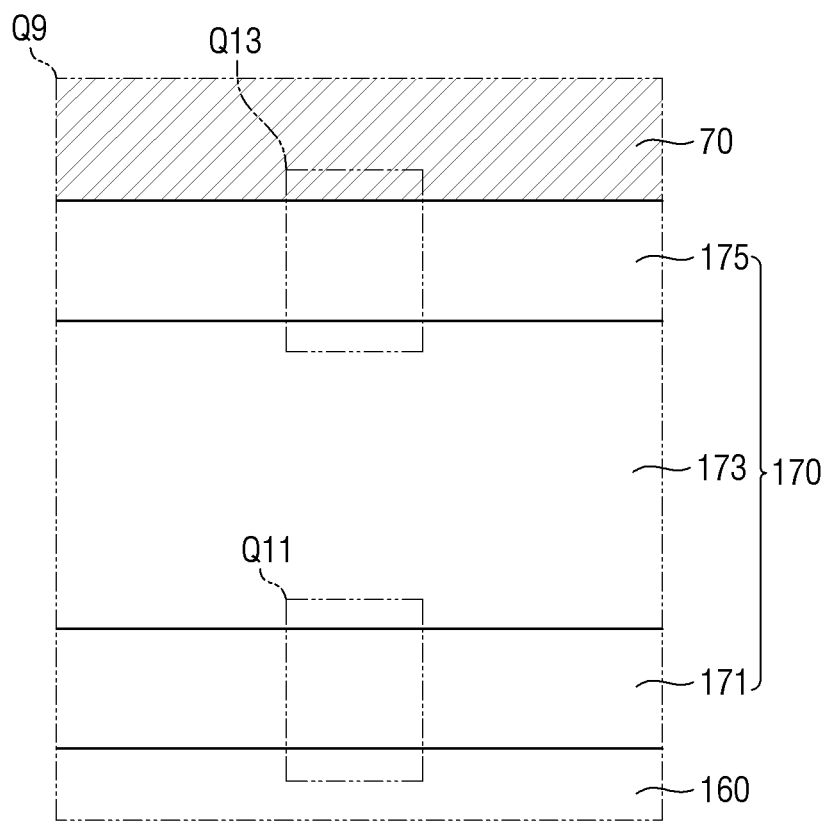
FIG. 18 is an enlarged cross-sectional view of area Q9 of FIG. 9.
Figure 19:
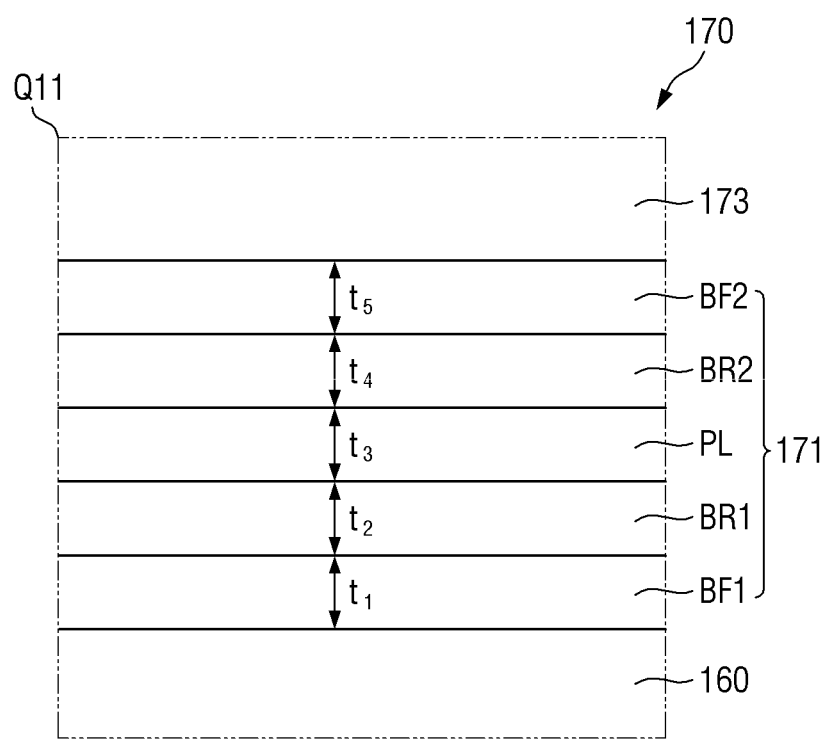
FIG. 19 is an enlarged cross-sectional view of area Q11 of FIG. 18.
Figure 20:
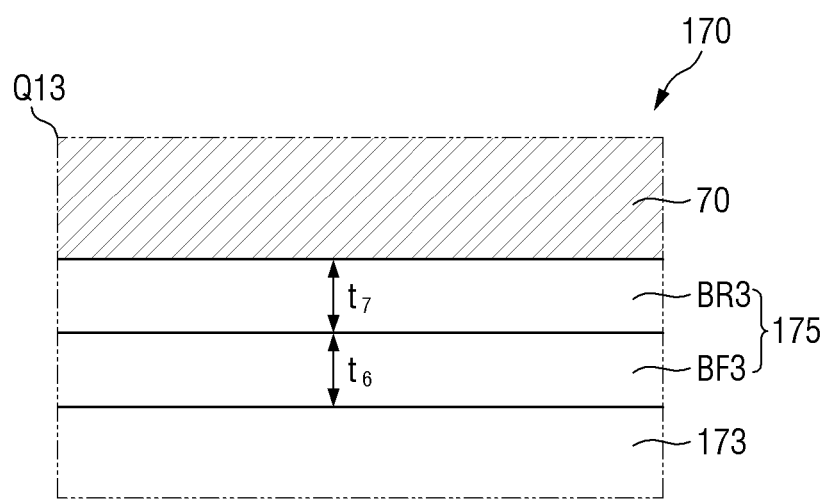
FIG. 20 is an enlarged cross-sectional view of area Q13 of FIG. 18.

FIG. 18 is an enlarged cross-sectional view of area Q9 of FIG. 9. FIG. 19 is an enlarged cross-sectional view of area Q11 of FIG. 18. FIG. 20 is an enlarged cross-sectional view of area Q13 of FIG. 18.

Referring to FIGS. 18-20, the encapsulation layer 170 may be disposed between the first capping layer 160 and the filler 70. As described above, the encapsulation layer 170 may include the lower inorganic layer 171 on the first capping layer 160, the organic layer 173 on the lower inorganic layer 171, and the upper inorganic layer 175 on the organic layer 173.

The lower inorganic layer 171 may include a plurality of layers stacked on one another, as shown in FIG. 19. According to an embodiment of the present disclosure, the lower inorganic layer 171 may include a first buffer layer BF1, a first barrier layer BR1 on the first buffer layer BF1, a first porous layer PL on the first barrier layer BR1, a second barrier layer BR2 on the first porous layer PL, and a second buffer layer BF2 on the second barrier layer BR2.

The first barrier layer BR1 may be disposed between the first buffer layer BF1 and the first porous layer PL, the second barrier layer BR2 may be disposed between the first porous layer PL and the second buffer layer BF2, and the second buffer layer BF2 may be disposed between the second barrier layer BR2 and the organic layer 173.

In addition, the first barrier layer BR1 and the second barrier layer BR2 may, for example, include the same material, may have the same thickness, and may have the same refractive index.

It is, however, to be understood that the present disclosure is not limited thereto. The first barrier layer BR1 and the second barrier layer BR2 may include different materials, may have different thicknesses, and may have different refractive indexes from each other.

In the following description, it is assumed that the first barrier layer BR1 and the second barrier layer BR2 include the same material, have the same thickness and have the same refractive index.

Each of the multiple layers of the lower inorganic layer 171 to be described in more detail below may have the light absorption efficiency (k) of zero. More specifically, if the light absorption efficiency (k) of each of the multiple layers of the lower inorganic layer 171 is greater than zero, some of lights generated from the lower light-emitting elements thereunder may be absorbed by the multiple layers of the lower inorganic layer 171. This may decrease the overall light efficiency of the display device 1.

The first buffer layer BF1 may be disposed on (e.g., directly on) the first capping layer 160. The first buffer layer BF1 may be in contact (e.g., direct contact) with the first barrier layer BR1 thereon.

The first buffer layer BF1 may be disposed on (e.g., directly on) the first capping layer 160 and may serve to block or substantially block physical damage to the first capping layer 160.

For example, the first buffer layer BF1 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

The thickness $t_1$ of the first buffer layer BF1 may be in the range of approximately 1 nm to approximately 1,000 nm. According to an embodiment of the present disclosure, the refractive index of the first buffer layer BF1 may be in the range of approximately 1.3 to approximately 1.75. For example, the refractive index of the first buffer layer BF1 may be approximately 1.6. The compressive stress of the first buffer layer BF1 may be in the range of approximately 0 to approximately 200 MPa.

The first barrier layer BR1 may be disposed on (e.g., directly on) the first buffer layer BF1 to block moisture and/or oxygen intruding from the outside.

For example, the first barrier layer BR1 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

The thickness $t_2$ of the first buffer layer BR1 may be in the range of approximately 1 nm to approximately 5,000 nm. According to an embodiment of the present disclosure, the refractive index of the first barrier layer BR1 may be greater than the refractive index of the first buffer layer BF1 described above. According to an embodiment of the present disclosure, the refractive index of the first barrier layer BR1 may be in the range of approximately 1.45 to approximately 1.85. For example, the refractive index of the first barrier layer BR1 may be approximately 1.7. The compressive stress of the first barrier layer BR1 may be in the range of approximately 0 to approximately 200 MPa.

The first porous layer PL may be disposed between the first barrier layer BR1 and the second barrier layer BR2, and thus it can store a part of moisture and/or oxygen that is introduced into the second barrier layer BR2 and is not completely absorbed by the second barrier layer BR2, which will be described in more detail below. To do so, it is desired that the structure of the material in the first porous layer PL is somewhat non-uniform. To this end, in the process of forming the first porous layer PL on the first barrier layer BR1, a process time may be increased or an additional process such as introducing outside air may be considered in order to lower the film uniformity. The method of forming the first porous layer PL may be any suitable method known in the art, and thus the method will not be described in detail. The refractive index of the first porous layer PL having low film uniformity may be lower than that of the buffer layers BF1 and BF2 as well as that of the adjacent barrier layers BR1 and BR2.

For example, the refractive index of the first porous layer PL may be lower than that of the adjacent barrier layers BR1 and BR2 by approximately 0.3. For example, the refractive index of the first porous layer PL may range from approximately 1.1 to approximately 1.45.

For example, the first porous layer PL may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like.

The thickness $t_3$ of the first porous layer PL may be in the range of approximately 1 nm to approximately 1,000 nm.

The second barrier layer BR2 may be disposed on the first porous layer PL. The material, the thickness $t_4$ and the refractive index of the second barrier layer BR2 are substantially identical to the material, the thickness and the refractive index of the first barrier layer BR1 described above; and, therefore, a redundant description may not be repeated.

The second buffer layer BF2 may be disposed between the second barrier layer BR2 and the organic layer 173. The thickness $t_5$ and the material of the second buffer layer BF2 may be identical to the thickness $t_1$ and the material of the first buffer layer BF1, respectively. It is, however, to be understood that the present disclosure is not limited thereto.

As described above, the organic layer 173 is disposed on the second buffer layer BF2. During the process of forming the organic layer 173, it is desired that the organic layer 173 spreads evenly on the surface of the second buffer layer BF2 and deposited on it. If the organic layer 173 is not spread evenly and is deposited on the surface of the second buffer layer BF2, an additional process for spreading the organic layer 173 may have to be carried out. If the deposition is completed as the organic layer 173 is not spread evenly, the organic layer 173 may not be deposited at some positions or it may be deposited too much at some positions and too little at other positions. As a result, the encapsulation layer 170 may be generally waved (e.g., generally have a wavy surface). To prevent or substantially prevent this, it is desired that the same material or a material of the same nature between organic/inorganic materials may be employed for the second buffer layer BF2 and the organic layer 173. It may be, however, difficult to contemplate it because the second buffer layer BF2 and the organic layer 173 have different functions. In view of the above, in the encapsulation layer 170 according to an embodiment of the present disclosure, the surface energy of the second buffer layer BF2 in contact with the organic layer 173 is above an appropriate or suitable level, so that the organic layer 173 can spread evenly on the surface of the second buffer layer BF2. According to an embodiment of the present disclosure, the surface energy of the second buffer layer BF2 may have a range of approximately 40 mN/m to approximately 80 mN/m. In order to obtain such a surface energy of the second buffer layer BF2, it may be contemplated to form the second buffer layer BF2 with a material having high surface energy. However, given functions and the material cost of the second buffer layer BF2, etc., it may be desirable to adjust the surface roughness of the second buffer layer BF2. According to an embodiment of the present disclosure, the surface roughness of the second buffer layer BF2 may be approximately 5 nm to approximately 100 nm.

The upper inorganic layer 175 may include a plurality of layers stacked on one another, as shown in FIG. 20. According to an embodiment of the present disclosure, the upper inorganic layer 175 may include a third buffer layer BF3 and a third barrier layer BR3 on the third buffer layer BF3.

The third buffer layer BF3 may be disposed between the organic layer 173 and the third barrier layer BR3, and the third barrier layer BR3 may be disposed between the third buffer layer BF3 and the filler 70. The third buffer layer BF3 may be in contact (e.g., direct contact) with the adjacent organic layer 173 and the third barrier layer BR3, and the third barrier layer BR3 may be in contact (e.g., direct contact) with the adjacent third buffer layer BF3 and the filler 70.

For example, the material, the thickness $t_6$, the refractive index and the compressive stress of the third buffer layer BF3 are substantially identical to the material, the thickness $t_1$, the refractive index and the compressive stress of the first buffer layer BF1 described above. The third buffer layer BF3 can reduce outgassing from the organic layer 173 thereunder.

The material and the thickness $t_7$ of the third barrier layer BR3 may be substantially identical to the material and the thickness $t_2$ of the first barrier layer BR1 described above. The third barrier layer BR3 can block or substantially block moisture and/or oxygen intruding from the outside.

According to the embodiment of the present disclosure, the display device 1 employs a sandwich structure (i.e., the first porous layer PL is interposed between the barrier layers BR1 and BR2 of the lower inorganic layer 171). Accordingly, the first porous layer PL can store a part of moisture and/or oxygen that is introduced into the second barrier layer BR2 and is not completely absorbed by the second barrier layer BR2. In this manner, it is possible to prevent or substantially prevent the moisture and/or oxygen from intruding into the encapsulation layer 170, so that the display device 1 can be stored more reliably and the lifetime of the display device 1 can be improved.

Hereinafter, display devices according to other embodiments of the present disclosure will be described in more detail. In the following description, the same or similar elements will be denoted by the same or similar reference numerals, and redundant descriptions may not be repeated or may be only briefly described.

Figure 21:
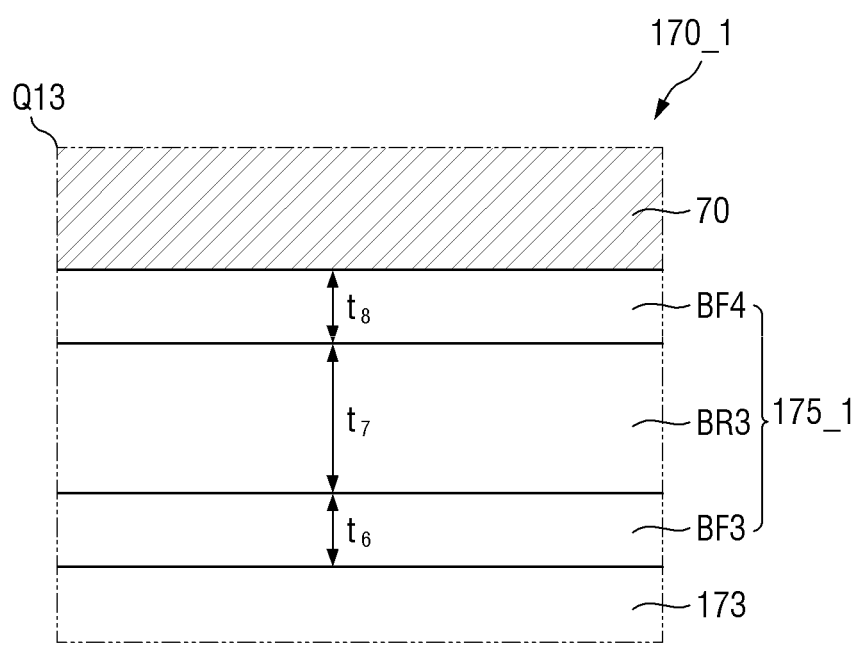
FIG. 21 is a cross-sectional view showing a modification of the encapsulation layer according to the embodiment of FIG. 20.

FIG. 21 is a cross-sectional view showing a modification of the encapsulation layer according to the embodiment of FIG. 20.

An encapsulation layer 170_1 according to the embodiment of FIG. 21 is different from the encapsulation layer 170 according to the above-described embodiment in that an upper inorganic layer 175_1 of the encapsulation layer 170_1 further includes a fourth buffer layer BF4.

More specifically, the upper inorganic layer 175_1 of the encapsulation layer 170_1 according to the illustrated embodiment may further include the fourth buffer layer BF4.

The fourth buffer layer BF4 of the upper inorganic layer 175_1 may be disposed between the third barrier layer BR3 and the filler 70, and may be in contact (e.g., direct contact) with the third barrier layer BR3 and the filler 70.

The material, the refractive index and the thickness $t_8$ of the fourth buffer layer BF4 may be substantially identical to the material, the refractive index and the thickness $t_6$ of the third buffer layer BF3 described above.

As described above, the filler 70 is disposed on the second buffer layer BF4. During the process of forming the filler 70, it is desired that filler 70 spreads evenly on the surface of the fourth buffer layer BF4 and deposited on it. If the filler 70 is not spread evenly and is deposited on the surface of the fourth buffer layer BF4, an additional process for spreading the filler 70 has to be carried out. If the deposition is completed as the filler 70 is not spread evenly, the filler 70 may not be deposited at some positions or it may be deposited too much at some positions and too little at other positions. As a result, the filler 70 may be generally waved (e.g., generally have a wavy surface). To prevent or substantially prevent this, it is desired that the same material or a material of the same nature between organic/inorganic materials may be employed for the fourth buffer layer BF4 and the filler 70. It may be, however, difficult to contemplate it because the fourth buffer layer BF4 and the filler 70 have different functions. In view of the above, in the encapsulation layer 170 according to an embodiment of the present disclosure, the surface energy of the fourth buffer layer BF4 in contact with the filler 70 is above an appropriate or suitable level, so that the filler 70 can spread evenly on the surface of the fourth buffer layer BF4. According to an embodiment of the present disclosure, the surface energy of the fourth buffer layer BF4 may have a range of approximately 40 mN/m to approximately 80 mN/m. In order to obtain such a surface energy of the second buffer layer BF4, it may be contemplated to form the fourth buffer layer BF4 with a material having high surface energy. However, given functions and the material cost of the fourth buffer layer BF4, etc., it may be desirable to adjust the surface roughness of the fourth buffer layer BF4. According to an embodiment of the present disclosure, the surface roughness of the fourth buffer layer BF4 may be approximately 5 nm to approximately 100 nm.

Figure 22:
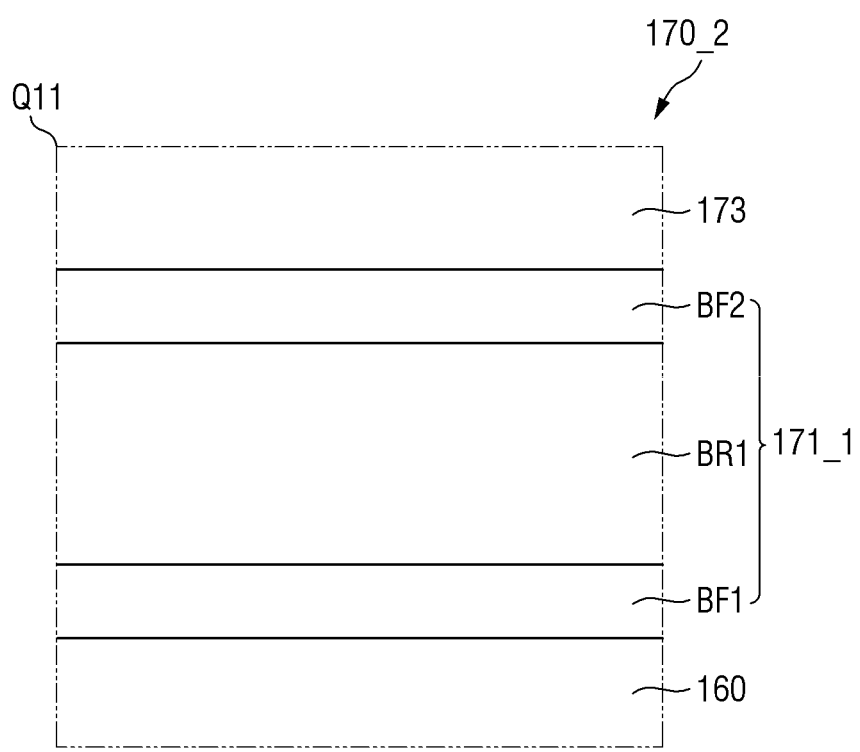
FIGS. 22 and 23 are cross-sectional views showing a modification of the encapsulation layer of FIG. 18.
Figure 23:
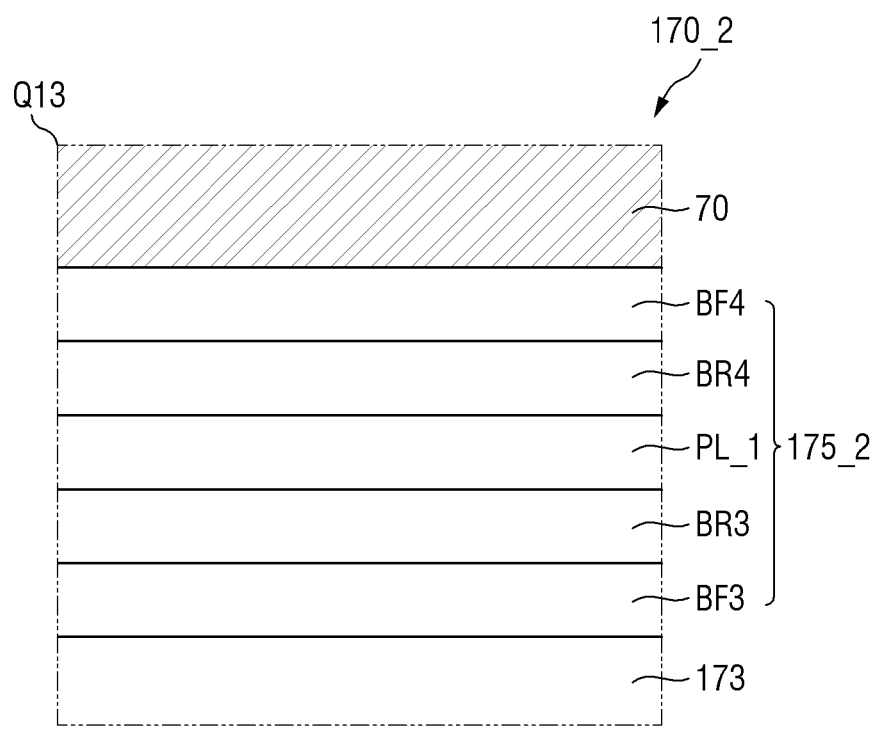

FIGS. 22 and 23 are cross-sectional views showing a modification of the encapsulation layer of FIG. 18.

An encapsulation layer 170_2 according to the embodiment of FIGS. 22 and 23 is different from the encapsulation layer 170 according to the above-described embodiment in that the encapsulation layer 170_2 includes a lower inorganic layer 171_1 and an upper inorganic layer 175_2.

More specifically, the encapsulation layer 170_2 according to the illustrated embodiment may include the lower inorganic layer 171_1 and the upper inorganic layer 175_2.

The lower inorganic layer 171_1 may include only the first buffer layer BF1, the first barrier layer BR1 and the second buffer layer BF2, compared to the lower inorganic layer 171 of FIG. 19. The first buffer layer BF1 may be disposed between the first capping layer 160 and the first barrier layer BR1, the first barrier layer BR1 may be disposed between the first buffer layer BF1 and the second buffer layer BF2, and the second buffer layer BF2 may be disposed between the first barrier layer BR1 and the organic layer 173. The first buffer layer BF1, the first barrier layer BR1 and the second buffer layer BF2 have been described above; and, therefore, a redundant description may not be repeated.

As shown in FIG. 23, the upper inorganic layer 175_2 according to the illustrated embodiment may include a third buffer layer BF3, a third barrier layer BR3, a second porous layer PL_1, a fourth barrier layer BR4, and a fourth buffer layer BF4. The third buffer layer BF3 may be disposed between the third barrier layer BR3 and the organic layer 173, the third barrier layer BR3 may be disposed between the third buffer layer BF3 and the second porous layer PL_1, the second porous layer PL_1 may be disposed between the third barrier layer BR3 and the fourth barrier layer BR4, the fourth barrier layer BR4 may be disposed between the fourth buffer layer BF4 and the second porous layer PL_1, and the fourth buffer layer BF4 may be disposed between the fourth barrier layer BR4 and the filler 70.

The third buffer layer BF3, the third barrier layer BR3 and the fourth buffer layer BF4 have been described above with reference to FIG. 21; and, therefore, a redundant description may not be repeated. The thickness, the material and the refractive index of the fourth barrier layer BR4 may be substantially identical to the thickness, the material and the refractive index of the third barrier layer BR3, respectively. The second porous layer PL_1 is substantially identical to the first porous layer PL described above with reference to FIG. 19; and, therefore, a redundant description may not be repeated.

Figure 24:
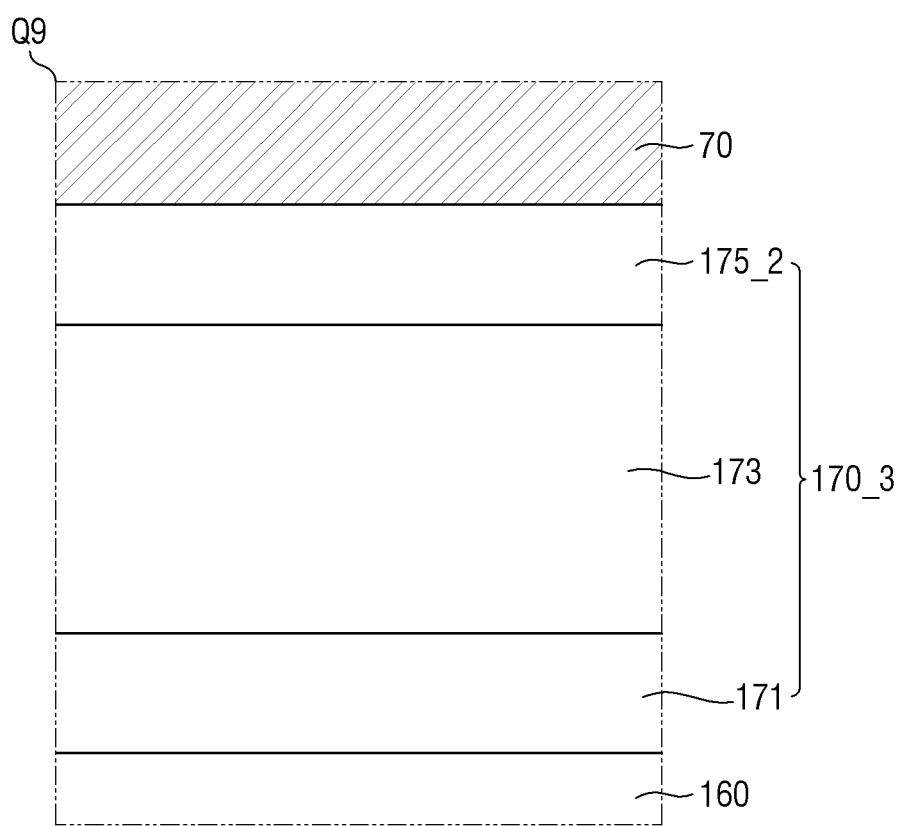
FIG. 24 is a cross-sectional view showing another modification of the encapsulation layer according to the embodiment of FIG. 18.

FIG. 24 is a cross-sectional view showing another modification of the encapsulation layer according to the embodiment of FIG. 18.

An encapsulation layer 170_3 according to the embodiment of FIG. 24 is different from the display device 1 according to the above-described embodiment in that the encapsulation layer 170_3 includes a lower inorganic layer 171, an organic layer 173 and an upper inorganic layer 175_2.

More specifically, the encapsulation layer 170_3 according to the illustrated embodiment may include the lower inorganic layer 171, the organic layer 173 and the upper inorganic layer 175_2. The upper inorganic layer 175_2 has been described above with reference to FIG. 23; and, therefore, a redundant description will not be repeated.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims, and equivalents thereof.

What is claimed is:

1. A display device comprising:
a first base having a display area and a non-display area;
light-emitting elements on the first base, the light-emitting elements being located in the display area; and
an encapsulation layer over the light-emitting elements, wherein the encapsulation layer comprises:
a first inorganic layer;
an organic layer on the first inorganic layer; and
a second inorganic layer on the organic layer,
wherein the first inorganic layer comprises:
a first buffer layer on the light-emitting elements;
a first barrier layer on the first buffer layer;
a first porous layer on the first barrier layer;
a second barrier layer on the first porous layer; and
a second buffer layer on the second barrier layer,
wherein a refractive index of the first buffer layer, a refractive index of the first barrier layer, and a refractive index of the first porous layer are different from one another, and
wherein the refractive index of the first porous layer is smaller than the refractive index of the first buffer layer and the refractive index of the first barrier layer.

2. The display device of claim 1, wherein the first barrier layer is between the first buffer layer and the first porous layer,
wherein the second barrier layer is between the first porous layer and the second buffer layer, and
wherein the second buffer layer is between the second barrier layer and the organic layer.

3. The display device of claim 2, wherein the refractive index of the first buffer layer is smaller than the refractive index of the first barrier layer.

4. The display device of claim 3, wherein the refractive index of the first porous layer is in a range of 1.1 to 1.45.

5. The display device of claim 4, wherein the refractive index of the first buffer layer is in a range of 1.3 to 1.75.

6. The display device of claim 5, wherein the refractive index of the first barrier layer is in a range of 1.45 to 1.85.

7. The display device of claim 6, wherein the refractive index of the first buffer layer is equal to the refractive index of the second buffer layer.

8. The display device of claim 6, wherein the second buffer layer is directly on the organic layer.

9. The display device of claim 8, wherein a surface roughness of the second buffer layer is in a range of 10 nm to 500 nm.

10. The display device of claim 8, wherein a surface energy of the second buffer layer is in a range of 40 mN/m to 80 mN/m.

11. The display device of claim 2, wherein the second inorganic layer comprises a third buffer layer on the organic layer and a third barrier layer on the third buffer layer.

12. The display device of claim 11, wherein the refractive index of the third buffer layer is smaller than the refractive index of the third barrier layer.

13. The display device of claim 12, wherein the second inorganic layer further comprises a fourth buffer layer on the third barrier layer,
wherein the third buffer layer is between the organic layer and the third barrier layer, and
wherein the third barrier layer is between the third buffer layer and the fourth buffer layer.

14. The display device of claim 13, further comprising:
a second base above the encapsulation layer;
color filters on a surface of the second base facing the first base, the color filters overlapping the light-emitting elements;
wavelength conversion patterns on the color filters; and
a filler between the first base and the second base.

15. The display device of claim 14, further comprising thin-film transistors between the first base and the light-emitting elements of the display area, the thin-film transistors electrically connected to the light-emitting elements,
wherein each of the thin-film transistors comprises:
a semiconductor layer on the first base;
a gate electrode on the semiconductor layer;
a source electrode connected to the semiconductor layer; and
a drain electrode connected to the semiconductor layer, and
wherein the semiconductor layer comprises an oxide semiconductor.

16. The display device of claim 15, wherein each of the light-emitting elements comprises:
an anode electrode above the source electrode and the drain electrode;
a cathode electrode facing the anode electrode; and
a plurality of emissive layers between the anode electrode and the cathode electrode, and
wherein the plurality of emissive layers forms a tandem structure in which the plurality of emissive layers overlap each other.

17. The display device of claim 15, further comprising: a light-blocking pattern between the first base and the semiconductor layer, the light-blocking pattern overlapping the semiconductor layer,
wherein the light-blocking pattern is electrically connected to the source electrode or the drain electrode.

18. The display device of claim 14, wherein the fourth buffer layer is in direct contact with the filler,
wherein a surface roughness of the fourth buffer layer is in a range of 10 nm to 500 nm, and
wherein a surface energy of the fourth buffer layer is in a range of 40 mN/m to 80 mN/m.

19. The display device of claim 13, wherein the second inorganic layer further comprises:
a fourth barrier layer between the third barrier layer and the fourth buffer layer; and
a second porous layer between the fourth barrier layer and the third barrier layer, and
wherein a refractive index of the second porous layer is smaller than the refractive index of the third buffer layer of the second inorganic layer, the refractive index of the third barrier layer, a refractive index of the fourth barrier layer, and a refractive index of the fourth buffer layer.

20. A display device comprising:
a first base having a display area and a non-display area;
light-emitting elements on the first base, the light-emitting elements being located in the display area; and
an encapsulation layer over the light-emitting elements,
wherein the encapsulation layer comprises:
a first inorganic layer;
an organic layer on the first inorganic layer; and
a second inorganic layer on the organic layer,
wherein the second inorganic layer comprises:
a first buffer layer on the organic layer;
a first barrier layer on the first buffer layer;
a first porous layer on the first barrier layer;
a second barrier layer on the first porous layer; and
a second buffer layer on the second barrier layer,
wherein a refractive index of the first buffer layer, a refractive index of the first barrier layer, and a refractive index of the first porous layer are different from one another, and
wherein the refractive index of the first porous layer is smaller than the refractive index of the first buffer layer and the refractive index of the first barrier layer.

21. The display device of claim 20, wherein the first inorganic layer comprises:
a third buffer layer on the light-emitting elements; and
a third barrier layer on the third buffer layer.

22. The display device of claim 21, wherein the first barrier layer is between the first buffer layer and the first porous layer,
wherein the second barrier layer is between the first porous layer and the second buffer layer, and
wherein the second buffer layer is between the second barrier layer and the organic layer.

23. The display device of claim 22, wherein the refractive index of the first buffer layer is less than the refractive index of the first barrier layer,
wherein the refractive index of the first porous layer is in a range of 1.1 to 1.45,
wherein the refractive index of the first buffer layer is in a range of 1.3 to 1.75, and
wherein the refractive index of the first barrier layer is in a range of 1.45 to 1.85.

* * * * *